(12) United States Patent
Iwashita et al.

(10) Patent No.: US 8,865,378 B2
(45) Date of Patent: Oct. 21, 2014

(54) PHOTOMASK BLANK, PHOTOMASK, AND METHODS OF MANUFACTURING THE SAME

(71) Applicants: Hiroyuki Iwashita, Tokyo (JP); Atsushi Kominato, Tokyo (JP); Masahiro Hashimoto, Tokyo (JP); Hiroaki Shishido, Tokyo (JP)

(72) Inventors: Hiroyuki Iwashita, Tokyo (JP); Atsushi Kominato, Tokyo (JP); Masahiro Hashimoto, Tokyo (JP); Hiroaki Shishido, Tokyo (JP)

(73) Assignee: Hoya Corporation, Tokyo (JP)

( * ) Notice: Subject to any disclaimer, the term of this patent is extended or adjusted under 35 U.S.C. 154(b) by 75 days.

(21) Appl. No.: 13/854,439

(22) Filed: Apr. 1, 2013

(65) Prior Publication Data

US 2013/0230795 A1 Sep. 5, 2013

Related U.S. Application Data

(62) Division of application No. 13/126,614, filed as application No. PCT/JP2009/068359 on Oct. 27, 2009, now Pat. No. 8,431,290.

(30) Foreign Application Priority Data

Oct. 29, 2008 (JP) ................................ 2008-278918

(51) Int. Cl.
*G03F 1/46* (2012.01)
*G03F 1/38* (2012.01)
*G03F 1/50* (2012.01)
*G03F 1/54* (2012.01)

(52) U.S. Cl.
CPC .. *G03F 1/50* (2013.01); *G03F 1/46* (2013.01); *G03F 1/54* (2013.01)

USPC ............................................................ 430/5

(58) Field of Classification Search
USPC .............. 430/5, 311, 322, 323, 394; 428/428, 428/430; 378/35
See application file for complete search history.

(56) References Cited

U.S. PATENT DOCUMENTS

| 6,576,375 B1 | 6/2003 | Miyoshi et al. |
| 2006/0088774 A1 | 4/2006 | Yoshikawa et al. |
| 2007/0212618 A1 | 9/2007 | Yoshikawa et al. |
| 2008/0063950 A1 | 3/2008 | Yoshikawa et al. |

FOREIGN PATENT DOCUMENTS

| JP | 2001-100393 A | 4/2001 |
| JP | 2006-078807 A | 3/2006 |
| JP | 2006-146151 A | 6/2006 |
| JP | 2007-241065 A | 9/2007 |
| JP | 2008-257274 A | 10/2008 |

*Primary Examiner* — Stephen Rosasco
(74) *Attorney, Agent, or Firm* — Sughrue Mion, PLLC

(57) ABSTRACT

A photomask blank is for use in manufacturing a photomask to be applied with exposure light having a wavelength of 200 nm or less. The photomask blank has a light-transmitting substrate and a light-shielding film formed thereon. The light-shielding film has a light-shielding layer containing a transition metal and silicon and a front-surface antireflection layer formed contiguously on the light-shielding layer and made of a material containing at least one of oxygen and nitrogen. The light-shielding film has a front-surface reflectance of a predetermined value or less for the exposure light and has a property capable of controlling the change width of the front-surface reflectance at the exposure wavelength to be within 2% when the thickness of the front-surface antireflection layer changes in the range of 2 nm. The material of the front-surface antireflection layer having a refractive index n and an extinction coefficient k capable of achieving such property is selected.

16 Claims, 16 Drawing Sheets

PHOTOMASK BLANK, PHOTOMASK, AND METHODS OF MANUFACTURING THE SAME

CROSS REFERENCE TO RELATED APPLICATIONS

This is a Divisional of application Ser. No. 13/126,614 filed Apr. 28, 2011, claiming priority based on International Application No. PCT/JP2009/068359 filed on Oct. 27, 2009, which claims priority from Japanese Patent Application No. 2008-278918 filed Oct. 29, 2008, the contents of all of which are incorporated herein by reference in their entirety.

TECHNICAL FIELD

This invention relates to a photomask blank and a photomask for use in the manufacture of semiconductor devices or the like and to methods of manufacturing the same, and so on.

BACKGROUND ART

The miniaturization of semiconductor devices and the like is advantageous in bringing about an improvement in performance and function (higher-speed operation, lower power consumption, etc.) and a reduction in cost and thus has been accelerated more and more. The lithography technique has been supporting this miniaturization and transfer masks are a key technique along with exposure apparatuses and resist materials.

In recent years, the development of the half-pitch (hp) 45 nm to 32 nm generations according to the semiconductor device design rule has been progressing. This corresponds to ¼ to ⅙ of a wavelength 193 nm of ArF excimer laser exposure light. Particularly in the hp45 nm and subsequent generations, only the application of the resolution enhancement technology (RET) such as the conventional phase shift method, oblique illumination method, and pupil filter method and the optical proximity correction (OPC) technique is becoming insufficient, and the hyper-NA technique (immersion lithography) and the double exposure (double patterning) technique are becoming necessary.

SUMMARY OF THE INVENTION

Problem to be Solved by the Invention

Normally, in the case of manufacturing a photomask having a mask pattern of a light-shielding film on a transparent substrate, the mask pattern is transferred by dry-etching the light-shielding film using as a mask a resist film formed with the mask pattern. In this event, the resist film is also etched to be consumed. In order to improve the resolution when the mask pattern is transferred to the light-shielding film, the resist film should remain with a predetermined thickness or more after the dry etching. However, if the thickness of the resist film is made thicker, there arises a problem of the collapse of the resist pattern and, therefore, it is not desirable to increase the film thickness.

In order to improve the resolution upon the transfer to the light-shielding film, it is effective to reduce the thickness of the light-shielding film. However, if the thickness of the light-shielding film is reduced, the OD value (optical density) decreases.

In JP-A-2006-78807 (Patent Document 1), in order to reduce the thickness of a light-shielding film, use is made of a transition metal silicide material with an absorption coefficient greater than that of a chromium-based material and, particularly in terms of the dry etchability, molybdenum silicide is described to be preferable. By this, the thickness of the light-shielding film can be made thinner than conventional.

In the meantime, normally, a light-shielding film of a mask blank has an at least two-layer structure of a front-surface antireflection layer and a light-shielding layer or a three-layer structure of a front-surface antireflection layer, a light-shielding layer, and a back-surface antireflection layer. The front-surface antireflection layer is designed such that the front-surface reflectance for exposure light becomes optimal with its thickness at a stage immediately after the manufacture of a photomask.

However, after the manufacture of the photomask, the occurrence of film loss of the front-surface antireflection layer cannot be prevented in the course of repeating photomask cleaning (ozone water cleaning or the like). Conventionally, not so much consideration is given to a change in front-surface reflectance due to the film loss of the front-surface antireflection layer. Particularly when a molybdenum silicide based material is used as the front-surface antireflection layer, the tendency of the film loss due to the photomask cleaning is significant.

The front-surface reflectance of the photomask is most affected by the properties (parameters) of the front-surface antireflection layer. The change in thickness of the front-surface antireflection layer tends to affect the front-surface reflectance. In a process of forming the front-surface antireflection layer in manufacturing processes of the mask blank, the front-surface antireflection layer is formed to a thickness as designed, but since the thickness of the front-surface antireflection layer is as thin as about 10 nm to 20 nm, it is difficult to form the front-surface antireflection layer to the designed thickness so that there may occur a difference in thickness of about 1 nm from the designed thickness.

There has been a problem that in the case where the film design is carried out without considering the change width of the front-surface reflectance due to the thickness, when the thickness of the front-surface antireflection layer deviates from the designed value as described above, the front-surface reflectance increases.

It is an object of this invention to provide a photomask blank having a light-shielding film which is capable of controlling the change width of a front-surface reflectance to be small with respect to a change in thickness of a front-surface antireflection layer.

Means for Solving the Problem

Various aspects of this invention will be described hereinbelow.

(Aspect 1)

A photomask blank for use in manufacturing a photomask adapted to be applied with exposure light having a wavelength of 200 nm or less, wherein the photomask blank comprises a light-transmitting substrate and a light-shielding film formed on the light-transmitting substrate, the light-shielding film comprises a light-shielding layer containing a transition metal and silicon, and a front-surface antireflection layer formed above and in contact with the light-shielding layer and made of a material containing at least one of oxygen and nitrogen, the light-shielding film has a front-surface reflectance of a predetermined value or less for the exposure light and has a property capable of controlling a change width of the front-surface reflectance at the exposure wavelength to be within 2% when a thickness of the front-surface antireflection layer is changed in a range of 2 nm, and a selection is made of the material of the front-surface antireflection layer having a refractive index n and an extinction coefficient k which can achieve the property.

(Aspect 2)

The photomask blank according to aspect 1, wherein the refractive index n of the front-surface antireflection layer is greater than 1.5 and 3.0 or less and the extinction coefficient k of the front-surface antireflection layer is 0.3 or more and 1.5 or less.

(Aspect 3)

The photomask blank according to aspect 1 or 2, wherein the front-surface reflectance of the light-shielding film at the exposure wavelength is 25% or less.

(Aspect 4)

The photomask blank according to any of aspects 1 to 3, wherein the thickness of the front-surface antireflection layer is 20 nm or less.

(Aspect 5)

The photomask blank according to any of aspects 1 to 4, wherein the light-shielding layer is formed of a material substantially comprising molybdenum and silicon.

(Aspect 6)

The photomask blank according to any of aspects 1 to 5, wherein the transition metal of the light-shielding layer is molybdenum and the molybdenum content is 20 at % or more and 40 at % or less.

(Aspect 7)

The photomask blank according to any of aspects 1 to 6, wherein the front-surface antireflection layer further contains silicon.

(Aspect 8)

The photomask blank according to aspect 7, wherein the front-surface antireflection layer further contains molybdenum.

(Aspect 9)

The photomask blank according to any of aspects 1 to 8, wherein the light-shielding film comprises a back-surface antireflection layer formed under and in contact with the light-shielding layer and containing at least one of oxygen and nitrogen and silicon.

(Aspect 10)

The photomask blank according to any of aspects 1 to 9, wherein the light-shielding film has a thickness of 60 nm or less.

(Aspect 11)

A photomask blank for use in manufacturing a photomask adapted to be applied with exposure light having a wavelength of 200 nm or less, wherein the photomask blank comprises a light-transmitting substrate and a light-shielding film formed on the light-transmitting substrate, the light-shielding film comprises a light-shielding layer containing a transition metal and silicon and a front-surface antireflection layer formed above and in contact with the light-shielding layer and made of a material containing at least one of oxygen and nitrogen, the light-shielding film has a front-surface reflectance of 25% or less for the exposure light and has a property capable of controlling a change width of the front-surface reflectance at the exposure wavelength to be within 3% when a thickness of the front-surface antireflection layer is changed in a range of 2 nm, and a selection is made of the material of the front-surface antireflection layer having a refractive index n and an extinction coefficient k which can achieve the property.

(Aspect 12)

The photomask blank according to aspect 11, wherein the refractive index n of the front-surface antireflection layer is 1.4 or more and 2.9 or less and the extinction coefficient k of the front-surface antireflection layer is 0.4 or more and 1.3 or less.

(Aspect 13)

The photomask blank according to aspect 11 to 12, wherein the thickness of the front-surface antireflection layer is 20 nm or less.

(Aspect 14)

The photomask blank according to any of aspects 11 to 13, wherein the light-shielding layer is formed of a material substantially comprising molybdenum, silicon, and nitrogen.

(Aspect 15)

The photomask blank according to any of aspects 11 to 14, wherein the transition metal of the light-shielding layer is molybdenum and the molybdenum content is 9 at % or more and 40 at % or less.

(Aspect 16)

The photomask blank according to any of aspects 11 to 15, wherein the front-surface antireflection layer further contains molybdenum and silicon.

(Aspect 17)

The photomask blank according to any of aspects 11 to 16, wherein the light-shielding film has a thickness of 60 nm or less.

(Aspect 18)

A method of manufacturing the photomask blank according to any of aspects 1 to 17, comprising obtaining relationships between thickness and front-surface reflectance of front-surface antireflection layers with respect to a predetermined light-shielding layer by changing a refractive index n and an extinction coefficient k of the front-surface antireflection layers to a plurality of values, and selecting, from the obtained relationships, a combination of a thickness change range, n, and k of the front-surface antireflection layer having a property capable of controlling a change width of the front-surface reflectance to a predetermined value or less with respect to a change in thickness in a predetermined range, and using the selected combination.

(Aspect 19)

A photomask manufactured using the photomask blank according to any of aspects 1 to 17.

(Aspect 20)

A method of manufacturing a photomask, using the photomask blank according to any of aspects 1 to 17.

(Aspect 21)

A semiconductor device manufacturing method of manufacturing a semiconductor device by transferring a pattern of the photomask according to aspect 19.

Effect of the Invention

According to this invention, it is possible to provide a photomask blank having a light-shielding film which is capable of controlling the change width of a front-surface reflectance to be small with respect to a change in thickness of a front-surface antireflection layer even in the case where the thickness of the front-surface antireflection layer is changed from a designed thickness thereof due to a film formation error in a film forming process in the manufacture of the mask blank or the thickness of the front-surface antireflection layer is reduced due to mask cleaning or the like after the manufacture of a photomask from the mask blank.

Mode for Carrying out the Invention

Figure 1:
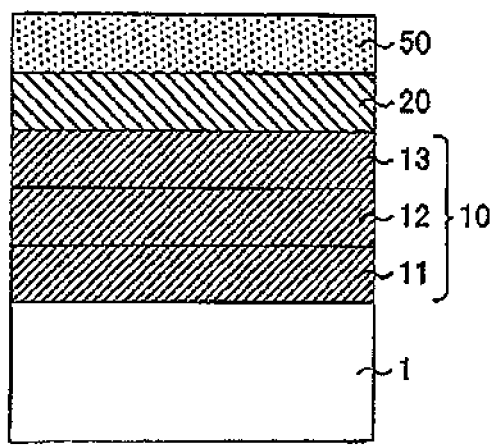
FIG. 1 is an exemplary cross-sectional view showing one example of a photomask blank according to Example 1 of this invention.

Hereinbelow, embodiments of this invention will be described.

A photomask blank according to the first embodiment of this invention is a photomask blank for use in manufacturing a photomask which is adapted to be applied with exposure light having a wavelength of 200 nm or less. The photomask blank comprises a light-transmitting substrate and a light-shielding film formed on the light-transmitting substrate, wherein the light-shielding film comprises a light-shielding layer containing a transition metal and silicon and a front-surface antireflection layer formed above and in contact with the light-shielding layer and made of a material containing at least one of oxygen and nitrogen and the light-shielding film (thus, the front-surface antireflection layer and the light-shielding layer) has a front-surface reflectance of a predetermined value or less for the exposure light and has a property capable of controlling the change width of the front-surface reflectance at the exposure wavelength to be within 2% when the thickness of the front-surface antireflection layer is changed in the range (change width) of 2 nm.

According to the above-mentioned first embodiment, it is possible to provide the photomask blank having the light-shielding film which is capable of controlling the change width of the front-surface reflectance to be small with respect to a change in thickness of the front-surface antireflection layer. As a consequence, the change in front-surface reflectance (particularly the increase in front-surface reflectance) due to the occurrence of film loss can be suppressed to be small in the course of repeating photomask cleaning (ozone water cleaning or the like) after the manufacture of the photomask.

Further, even when the thickness of the front-surface antireflection layer immediately after the formation thereof deviates (e.g. about 2 nm) from a designed value, the change in front-surface reflectance (particularly the increase in front-surface reflectance) caused by the difference in thickness from the designed thickness can be suppressed to be small.

In the above-mentioned first embodiment, the light-shielding film (thus, the front-surface antireflection layer and the light-shielding layer) has the property that the change in front-surface reflectance is 1%/nm with respect to a change in thickness of the front-surface antireflection layer.

A photomask blank according to the second embodiment of this invention is also a photomask blank for use in manufacturing a photomask which is adapted to be applied with exposure light having a wavelength of 200 nm or less. The photomask blank comprises a light-transmitting substrate and a light-shielding film formed on the light-transmitting substrate, wherein the light-shielding film comprises a light-shielding layer containing a transition metal and silicon and a front-surface antireflection layer formed above and in contact with the light-shielding layer and made of a material containing at least one of oxygen and nitrogen and the light-shielding film (thus, the front-surface antireflection layer and the light-shielding layer) has a front-surface reflectance of 25% or less for the exposure light and has a property capable of controlling the change width of the front-surface reflectance at the exposure wavelength to be within 3% when the thickness of the front-surface antireflection layer is changed in the range of 2 nm.

According to the above-mentioned second embodiment, it is possible to provide the photomask blank having the light-shielding film which is capable of controlling the change width of the front-surface reflectance to be small with respect to a change in thickness of the front-surface antireflection layer. When the front-surface reflectance is set to as low as 25% or less, the allowable change width can be set to 3%. As a consequence, the change in front-surface reflectance (particularly the increase in front-surface reflectance) due to the occurrence of film loss can be suppressed to be small in the course of repeating photomask cleaning (ozone water cleaning or the like) after the manufacture of the photomask.

Further, even when the thickness of the front-surface antireflection layer immediately after the formation thereof deviates (e.g. about 2 nm) from a designed value, the change in front-surface reflectance (particularly the increase in front-surface reflectance) caused by the difference in thickness from the designed thickness can be suppressed to be small.

In the above-mentioned second embodiment, the light-shielding film (thus, the front-surface antireflection layer and the light-shielding layer) has the property that the change in front-surface reflectance is 1.5%/nm with respect to a change in thickness of the front-surface antireflection layer.

As described above, the light-shielding film (thus, the front-surface antireflection layer and the light-shielding layer) has the property capable of controlling the change width of the front-surface reflectance to be within 2% or within 3% when the thickness of the front-surface antireflection layer is changed in the range (change width) of 2 nm. As a material of the front-surface antireflection layer, a selection is made of a material having n and k which can control the change width of the front-surface reflectance to be within 2% or within 3% when the thickness of the front-surface antireflection layer is changed in the range of 2 nm. A selection may also be made of a material of the front-surface antireflection layer having n and k such that, with the predetermined front-surface reflectance or less, the change width of the front-surface reflectance becomes the predetermined value or less with respect to a change in thickness, in the predetermined range, of the front-surface antireflection layer formed on the light-shielding layer. A selection may also be made of a material of the front-surface antireflection layer having n and k such that, with the predetermined front-surface reflectance or less, the change width of the front-surface reflectance becomes the predetermined value or less with respect to a change in thickness (a change in thickness from a designed value in the film formation or a change in thickness in the manufacture of a mask or in the use thereof) in the predetermined range (the respective layers are controlled so that the change width of the front-surface reflectance becomes the predetermined value or less). A selection may also be made of a material (a combination of a thickness change range, n, and k) of the front-surface antireflection layer having a property capable of, with the predetermined front-surface reflectance or less, controlling the change width of the front-surface reflectance to the predetermined value or less with respect to a change in thickness in the predetermined range. A selection may also be made of a material (a combination of a thickness change range, n, and k) of the front-surface antireflection layer in terms of a predetermined material (a combination of n and k) of the light-shielding layer.

The design concept of n and k described above is different from, for example, the design concept of n and k that gives priority to significantly reducing the front-surface reflectance.

The thickness change range of the front-surface antireflection layer can be selected, for example, in the thickness range of greater than 10 nm and 20 nm or less (further, 10 nm or more and 15 nm or less) of the front-surface antireflection layer, as an arbitrary range (e.g. a thickness range of 10 nm or more and 12 nm or less, a thickness range of 13 nm or more and 15 nm or less, a thickness range of 18 nm or more and 20 nm or less, or the like) in which the thickness changes in the range (change width) of 2 nm.

The design thickness of the front-surface antireflection layer can be arbitrarily determined in the above-mentioned thickness range. For example, it can be set to a middle value or to an upper limit value in consideration of film loss, or, in consideration of a film formation error (e.g. 1 nm), it can be set on a lower limit side, corresponding to the film formation error, from the upper limit value.

In a graph showing the relationship between the thickness and the front-surface reflectance of a front-surface antireflection layer with respect to a predetermined light-shielding layer (further in a graph group obtained by changing n and k, respectively), a selection is made of a combination of a thickness change range, n, and k of the front-surface antireflection layer corresponding to a portion (thickness range) where the change in front-surface reflectance is small with respect to a change in thickness, i.e. visually a flat portion with a small angle between itself and the thickness (abscissa axis) in the graph, and use is made of the selected combination.

For example, graphs showing the relationships between the thickness and the front-surface reflectance of front-surface antireflection layers with respect to a predetermined light-shielding layer are obtained by changing the refractive index n and the extinction coefficient k of the front-surface antireflection layers to a plurality of values, then a selection is made, from the graphs obtained above, of a combination of a thickness change range, n, and k of the front-surface antireflection layer having a property capable of controlling the change width of the front-surface reflectance to a predetermined value or less with respect to a change in thickness in a predetermined range, and use is made of the selected combination.

Figure 3:
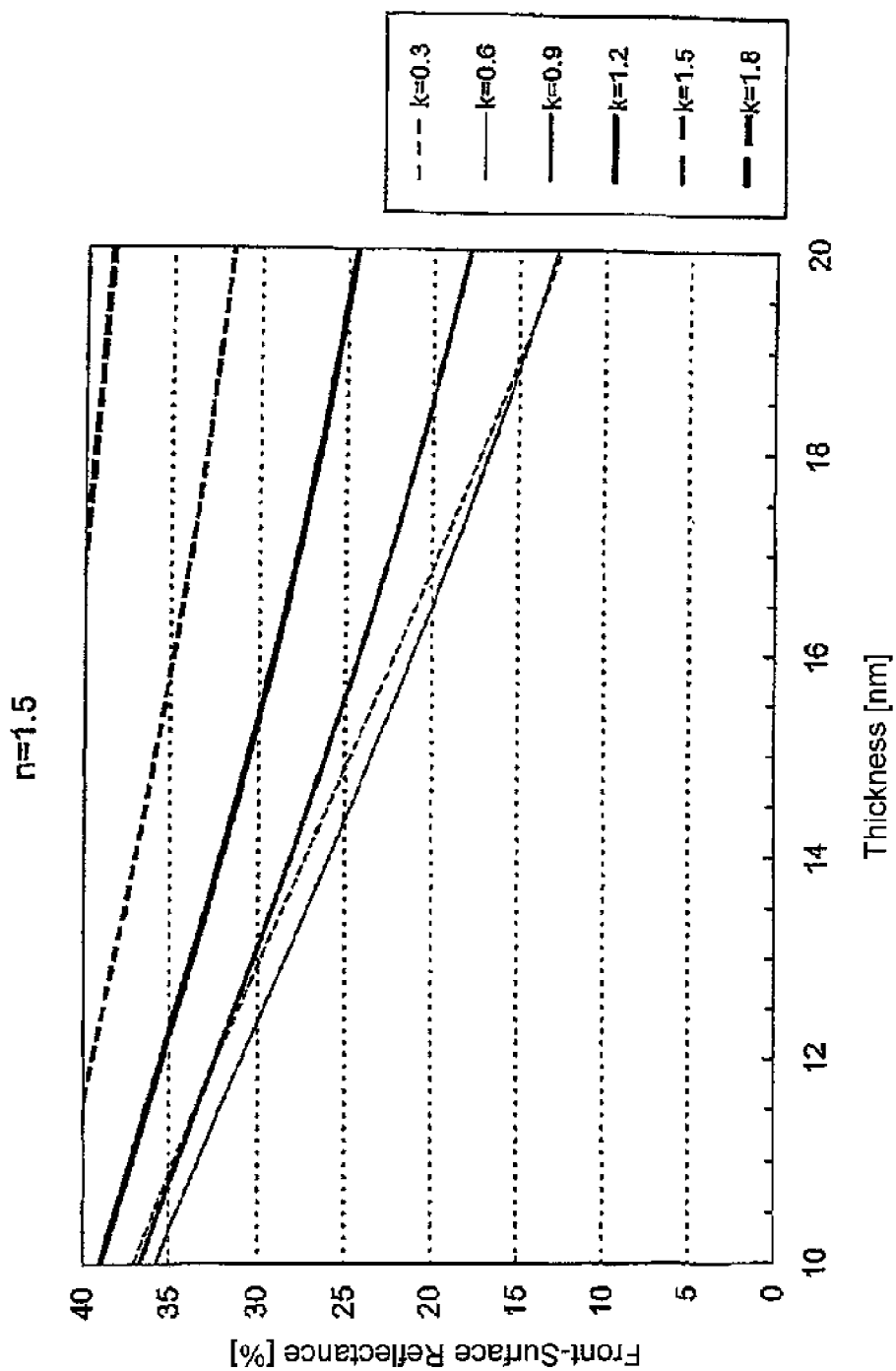
FIG. 3 is a diagram obtained in Example 1 of this invention and showing the relationships between the thickness and the front-surface reflectance of front-surface antireflection layers when the refractive index n of the front-surface antireflection layers is fixed while the extinction coefficient k thereof is changed to a plurality of values.
Figure 4:
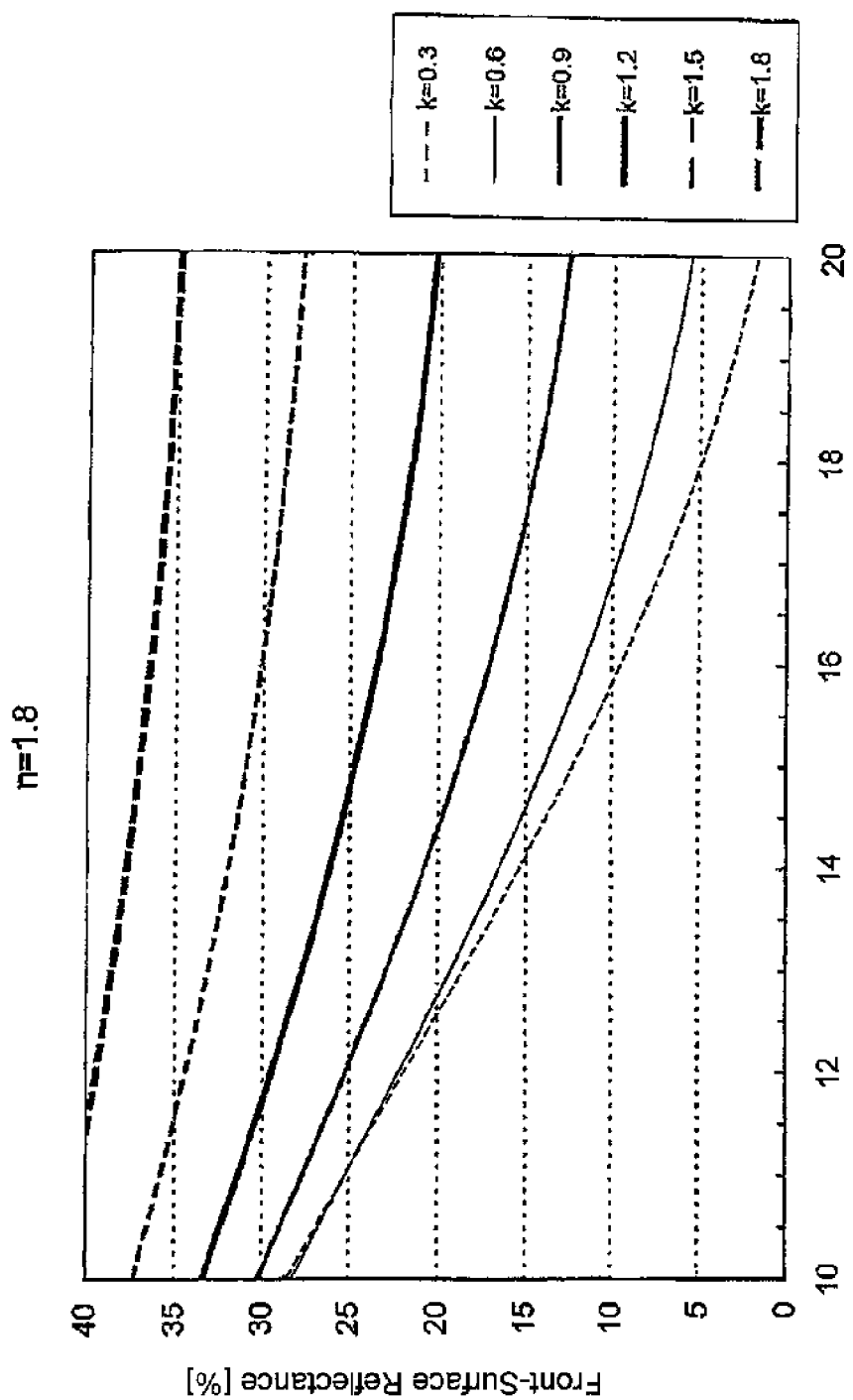
FIG. 4 is a diagram obtained in Example 1 of this invention and showing the relationships between the thickness and the front-surface reflectance of front-surface antireflection layers when the refractive index n of the front-surface antireflection layers is set to a value different from that in FIG. 3 while the extinction coefficient k thereof is changed to the plurality of values.
Figure 5:
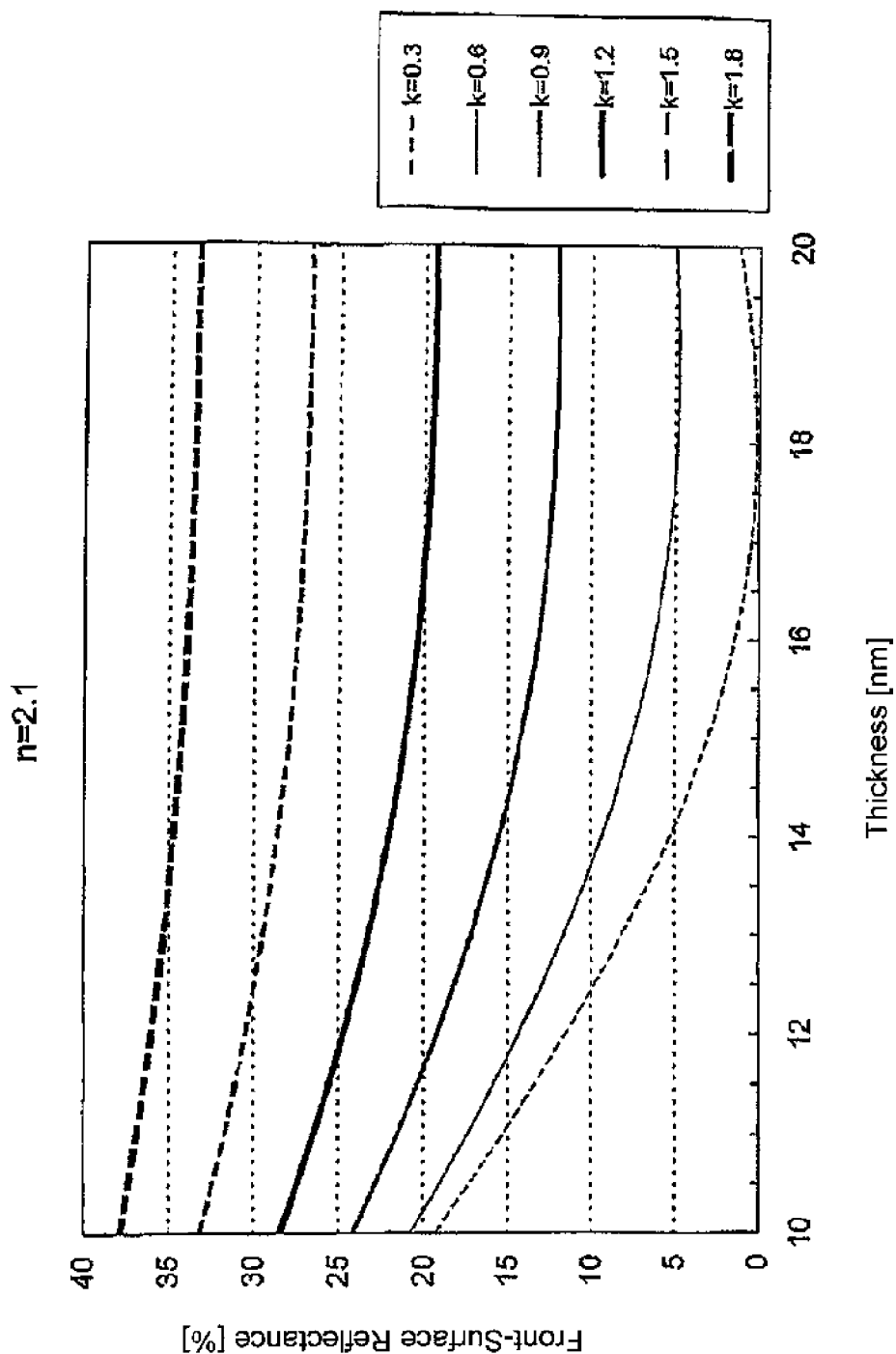
FIG. 5 is a diagram obtained in Example 1 of this invention and showing the relationships between the thickness and the front-surface reflectance of front-surface antireflection layers when the refractive index n of the front-surface antireflection layers is set to a value different from those in FIGS. 3 and 4 while the extinction coefficient k thereof is changed to the plurality of values.

More specifically, for example, first, a material of a light-shielding layer is fixed (in this event, n and k of the light-shielding layer are determined), then n and k of a front-surface antireflection layer are fixed, and a graph A showing the relationship between the thickness and the front-surface reflectance of the front-surface antireflection layer is obtained by optical simulation (e.g. k=1.2 in FIG. 3 (graph 1)). Similarly, graphs B are obtained by fixing n while changing k (e.g. k=0.3, 0.6, 0.9, 1.5, and 1.8 in FIG. 3 (graph 1)). Similarly to the graphs B, graphs C are obtained by changing n (a graph group of FIGS. 3 to 8 (graphs 1 to 6)). From this graph group C, a selection is made of a material of the front-surface antireflection layer (a combination of a thickness change range, n, and k of the front-surface antireflection layer) having a property capable of controlling the change width of the front-surface reflectance to a predetermined value or less with respect to a change in thickness in a predetermined range, and use is made of the selected combination. In this event, it is possible to select the combination which minimizes the change width of the front-surface reflectance, and to use the selected combination.

As described above, in the total of 36 kinds, i.e. 6 kinds (6 levels) of change in k and 6 kinds (6 levels) of change in n, those kinds satisfying the above-mentioned predetermined conditions are specified, then those kinds satisfying conditions required for a light-shielding film such as a predetermined OD or higher over the entire light-shielding film are further specified, and then, among them, the most preferable kind is selected. Thus, it is not easy to find out the one that satisfies such selection conditions of this invention.

Each of the above-mentioned first and second embodiments is different from the design concept that gives priority to significantly reducing the front-surface reflectance. For example, in the case of estimating a film loss of 2 nm and selecting and using a thickness range of 13 nm to 15 nm in a curve of k=1.2 in FIG. 6 (graph 4) (n=2.36), even if the thickness changes in this range, the front-surface reflectance remains about 21% and thus the change width of the front-surface reflectance is suppressed to about 1%. As described above, by obtaining the graphs A, B, or C, a selection may be made of a material of the front-surface antireflection layer (a combination of a thickness change range, n, and k of the front-surface antireflection layer) having a property capable of controlling the change width of the front-surface reflectance to a predetermined value or less with respect to a change in thickness in a predetermined range.

In each of the above-mentioned first and second embodiments, 36 kinds of graphs are produced by carrying out optical simulations with n and k each changed in 6 levels. If more graphs are produced by carrying out optical simulations with n and k each changed in more levels, to thereby select a material of the front-surface antireflection layer, the material selection accuracy is further improved.

The front-surface antireflection layer preferably has a refractive index n of greater than 1.5 and 3.0 or less and an extinction coefficient k of 0.3 or more and 1.5 or less.

In general, the front-surface reflectance for exposure light having a wavelength of 200 nm or less (ArF excimer laser exposure light or the like) is set to at least 30% or less. Therefore, it is preferable to select a material of the front-surface antireflection layer (a combination of a thickness change range, n, and k of the front-surface antireflection layer) adapted to provide a front-surface reflectance of 30% or less and having a property capable of controlling the change width of the front-surface reflectance to be within 2% when the thickness of the front-surface antireflection layer is changed in the range of 2 nm. When a study is made of a material of the front-surface antireflection layer satisfying the above-mentioned conditions on the basis of the respective graphs in FIGS. 3 to 8, it is seen that a material group with a refractive index n of 1.5 does not satisfy the conditions to a degree and thus is inadequate (but, if slightly exceeding 1.5, there is a material group that satisfies the conditions). In material groups with a refractive index n of up to 3.0, there are materials that satisfy the conditions. On the other hand, even in a material group with an extinction coefficient k of 0.3, there are materials that satisfy the conditions. A material group with an extinction coefficient k of 1.8 does not satisfy the conditions and, even if falling slightly below 1.8, the conditions are not satisfied. In a material group with an extinction coefficient k of 1.5, there are materials that satisfy the conditions. Based on the study described above, a selection is made of the above-mentioned ranges of the refractive index n and the extinction coefficient k which are preferable for a material to be used as the front-surface antireflection layer.

A material containing a transition metal and silicon (including a transition metal silicide) is used as the light-shielding layer. As the usable transition metal, there can be cited molybdenum, tantalum, tungsten, titanium, chromium, hafnium, nickel, vanadium, zirconium, ruthenium, rhodium, or the like, and one or two or more kinds of them may be added to silicon.

The front-surface reflectance of the light-shielding film is preferably 25% or less.

The front-surface reflectance of 30% is a minimal numerical value and, in order to make the front-surface antireflection more effective, the front-surface reflectance for the exposure light is preferably set to 25%.

For example, a selection is made of a material of the front-surface antireflection layer with n and k having a property such that the light-shielding film has a front-surface reflectance of 25% or less and the change width of the front-surface reflectance is within 2% when the thickness of the front-surface antireflection layer is changed in the range of 2 nm.

When a study is made of a material of the front-surface antireflection layer satisfying such conditions by the same technique on the basis of the respective graphs in FIGS. 3 to 8, it is seen that a selection may be made of a material having a refractive index n of 1.8 or more and 3.0 or less and an extinction coefficient k of 0.3 or more and 1.2 or less.

The front-surface antireflection layer preferably has a refractive index n of 1.4 or more and 2.9 or less and an extinction coefficient k of 0.4 or more and 1.3 or less.

When the front-surface reflectance for exposure light having a wavelength of 200 nm or less (ArF excimer laser exposure light or the like) is 25% or less, it is possible to select a material of the front-surface antireflection layer (a combination of a thickness change range, n, and k of the front-surface antireflection layer) having a property capable of controlling the change width of the front-surface reflectance to be within 3% when the thickness of the front-surface antireflection layer is changed in the range of 2 nm.

When a study is made of a material of the front-surface antireflection layer satisfying the above-mentioned conditions on the basis of respective graphs in FIGS. 11 to 16, in a material group with a refractive index n of 1.4, there are materials that satisfy the conditions in the ranges where the extinction coefficient k is 0.7 to 1.0 and the thickness is 14 to 20 nm. In a material group with a refractive index n of 1.7, there are materials that satisfy the conditions in the ranges where the extinction coefficient k is 0.4 to 1.0 and the thickness is 13 to 20 nm. In a material group with a refractive index n of 2.0, there are materials that satisfy the conditions in the ranges where the extinction coefficient k is 0.4 to 1.3 and the thickness is 10 to 20 nm. In a material group with a refractive index n of 2.31, there are materials that satisfy the conditions in the ranges where the extinction coefficient k is 0.4 to 1.3 and the thickness is 8 to 20 nm. In a material group with a refractive index n of 2.6, there are materials that satisfy the conditions in the ranges where the extinction coefficient k is 0.4 to 1.0 and the thickness is 8 to 20 nm. In a material group with a refractive index of 2.9, there are materials that satisfy the conditions in the ranges where the extinction coefficient k is 0.4 to 1.0 and the thickness is 8 to 17 nm.

On the other hand, in a material group with an extinction coefficient k of 0.4, there are materials that satisfy the conditions in the ranges where the refractive index n is 1.7 to 2.9 and the thickness is 8 to 20 nm. In a material group with an extinction coefficient k of 0.7, there are materials that satisfy the conditions in the ranges where the refractive index n is 1.4 to 2.9 and the thickness is 8 to 20 nm. In a material group with an extinction coefficient k of 1.0, there are materials that satisfy the conditions in the ranges where the refractive index n is 1.4 to 2.9 and the thickness is 8 to 20 nm. In a material group with an extinction coefficient k of 1.3, there are materials that satisfy the conditions in the ranges where the refractive index n is 2.0 to 2.31 and the thickness is 15 to 20 nm. In material groups with extinction coefficients k of 1.6 and 1.9, there is no material that satisfies the conditions.

Based on the study described above, a selection is made of the above-mentioned ranges of the refractive index n and the extinction coefficient k which are preferable for a material to be used as the front-surface antireflection layer.

Further, when the front-surface reflectance for the exposure light is 25% or less, it is preferable to select a material having a property capable of controlling the change width of the front-surface reflectance at the exposure wavelength to be within 2% when the thickness of the front-surface antireflection layer is changed (reduced) in the range of 2 nm.

When a study is made of a material of the front-surface antireflection layer satisfying the above-mentioned conditions on the basis of the respective graphs in FIGS. 11 to 16, in a material group with a refractive index n of 1.4, there are materials that satisfy the conditions in the ranges where the extinction coefficient k is 1.0 and the thickness is 17 to 20 nm. In a material group with a refractive index n of 1.7, there are materials that satisfy the conditions in the ranges where the extinction coefficient k is 0.7 to 1.0 and the thickness is 15 to 20 nm. In a material group with a refractive index n of 2.0, there are materials that satisfy the conditions in the ranges where the extinction coefficient k is 0.4 to 1.3 and the thickness is 12 to 20 nm. In a material group with a refractive index n of 2.31, there are materials that satisfy the conditions in the ranges where the extinction coefficient k is 0.4 to 1.3 and the thickness is 10 to 20 nm. In a material group with a refractive index n of 2.6, there are materials that satisfy the conditions in the ranges where the extinction coefficient k is 0.4 to 1.0 and the thickness is 8 to 20 nm. In a material group with a refractive index of 2.9, there are materials that satisfy the conditions in the ranges where the extinction coefficient k is 0.4 to 1.0 and the thickness is 8 to 14 nm.

On the other hand, in a material group with an extinction coefficient k of 0.4, there are materials that satisfy the conditions in the ranges where the refractive index n is 2.0 to 2.9 and the thickness is 8 to 20 nm. In a material group with an extinction coefficient k of 0.7, there are materials that satisfy the conditions in the ranges where the refractive index n is 1.7 to 2.9 and the thickness is 8 to 20 nm. In a material group with an extinction coefficient k of 1.0, there are materials that satisfy the conditions in the ranges where the refractive index n is 1.4 to 2.9 and the thickness is 8 to 20 nm. In a material group with an extinction coefficient k of 1.3, there are materials that satisfy the conditions in the ranges where the refractive index n is 2.0 to 2.31 and the thickness is 15 to 20 nm. In material groups with extinction coefficients k of 1.6 and 1.9, there is no material that satisfies the conditions.

From the study described above, it is seen that, as a material which is used as the front-surface antireflection layer and satisfies the above-mentioned conditions, a selection may be made of a material having a refractive index n of 1.4 or more and 2.9 or less and an extinction coefficient k of 0.4 or more and 1.3 or less.

The thickness of the front-surface antireflection layer is preferably 20 nm or less.

Only in terms of controlling the change width of the front-surface reflectance to the predetermined value or less, a considerably wide range of materials (a very wide range of combinations of n and k) can be used by increasing the thickness of the front-surface antireflection layer. However, the front-surface antireflection layer is part of the light-shielding film and the extinction coefficient k of the front-surface antireflection layer is much smaller than the extinction coefficient k of the light-shielding layer, and therefore, the ratio of its contribution to the absorption coefficient of the entire light-shielding film is low. As a consequence, even if the thickness of the front-surface antireflection layer is increased, the thickness of the light-shielding layer cannot be reduced correspondingly. In view of the above, the thickness of the front-surface antireflection layer forming part of the light-shielding film is preferably 20 nm or less.

The thickness of the front-surface antireflection layer is preferably 10 nm or more and 20 nm or less and more preferably 12 nm to 17 nm.

The light-shielding layer is preferably formed of a material substantially comprising molybdenum and silicon (including molybdenum silicide).

The light-shielding layer is preferably formed of a material substantially comprising molybdenum, silicon, and nitrogen. This is because the light-shielding layer is required to have a predetermined OD or higher in terms of reducing the thickness of the light-shielding film and thus it is preferable to use the material containing molybdenum and silicon, which has high light-shielding performance.

In the light-shielding layer substantially comprising molybdenum and silicon, the molybdenum content is preferably 20 at % or more and 40 at % or less. This is because the light-shielding layer is required to have a predetermined OD or higher in terms of reducing the thickness of the light-shielding film and thus it is preferable that the light-shielding layer be a metal film in the form of a MoSi film and that the Mo content be set to 20 at % or more and 40 at % or less.

Figure 9:
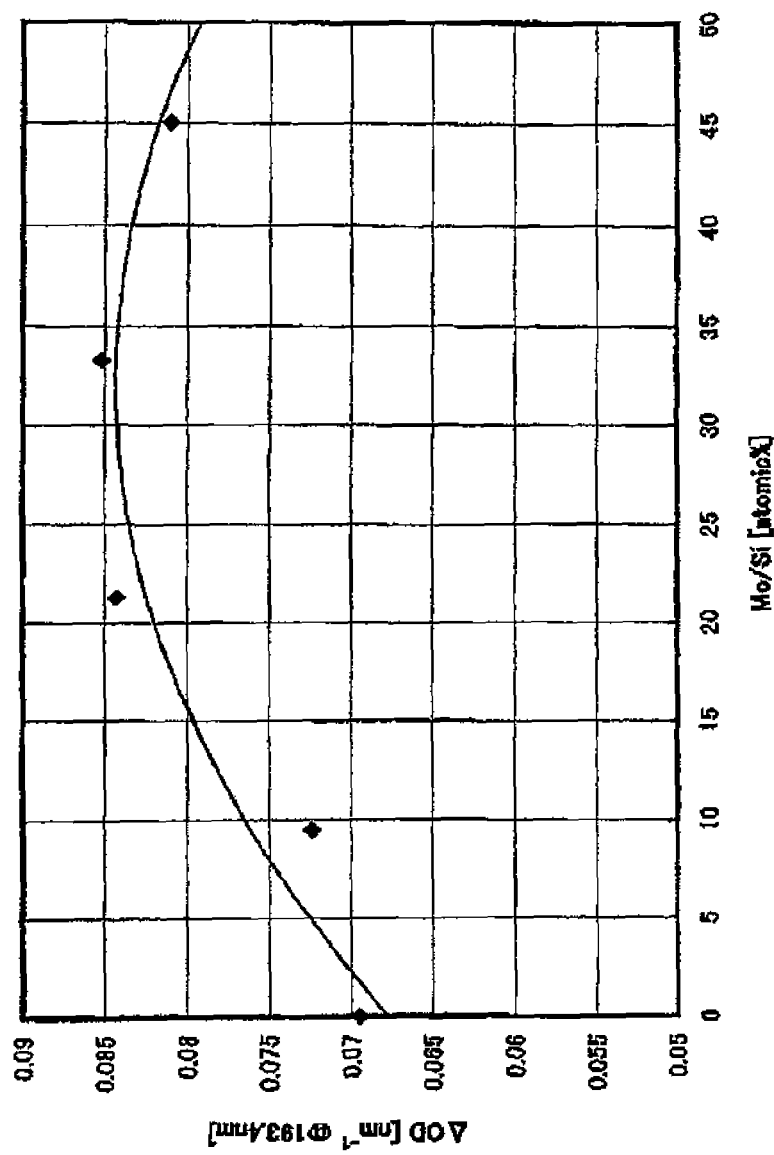
FIG. 9 is a diagram showing the relationship between the molybdenum content and the optical density per unit thickness in a thin film in the form of a MoSi film.

Specifically, as shown in FIG. 9, if the molybdenum content is 20 at % or more, the optical density can be set to $\Delta OD=0.082$ $nm^{-1}$@193.4 nm or more, which is thus preferable.

In the case of the light-shielding layer in the form of the MoSi film in which the molybdenum content is 20 at % or more and 40 at % or less, the present inventors have found that, as shown in FIG. 9, it is possible to obtain the light-shielding layer having a relatively high light-shielding property for ArF excimer laser exposure light as compared with compositions (the molybdenum content is less than 20 at % or greater than 40 at %) outside of this range, that even if the thickness of the light-shielding layer is 40 nm or less which is much smaller than conventional, a predetermined light-shielding property (optical density) is obtained, and further that, by combining it with a front-surface antireflection layer and a back-surface antireflection layer each having a light-shielding property equal to conventional, the light-shielding property (optical density 2.8 or more, preferably 3 or more) sufficient for a light-shielding film of a photomask for ArF excimer laser exposure is obtained.

In the light-shielding layer substantially comprising molybdenum, silicon, and nitrogen, the molybdenum content is preferably 9 at % or more and 40 at % or less.

In the case of the MoSiN film in which the molybdenum content is 9 at % or more and 40 at % or less, the present inventors have found that, by adjusting the nitrogen content, it is possible to obtain the light-shielding layer having a high optical density per unit thickness and having a relatively high light-shielding property for ArF excimer laser exposure light, that even if the thickness of the light-shielding layer is 50 nm or less, a predetermined light-shielding property (optical density) is obtained, and further that, by combining it with a front-surface antireflection layer having a light-shielding property equal to conventional, the light-shielding property (optical density 2.8 or more, preferably 3 or more) sufficient for a light-shielding film of a photomask for ArF excimer laser exposure is obtained.

Using the light-shielding layer having the above-mentioned predetermined composition, the following functions and effects are obtained by a reduction in thickness of the light-shielding layer (reduction in thickness of a transfer pattern due to a reduction in thickness of the light-shielding film).

1) It is possible to achieve prevention of the collapse of the transfer pattern in mask cleaning.

2) With the reduction in thickness of the light-shielding layer, the side wall height of the transfer pattern is also reduced and, therefore, the pattern accuracy particularly in the side wall height direction is improved so that the CD accuracy (particularly the linearity) can be enhanced.

3) With respect to a photomask particularly for use in the hyper-NA (immersion) generation, it is necessary to reduce the thickness of a transfer pattern (reduce the side wall height of a transfer pattern) as a shadowing measure and this requirement can be satisfied.

The film containing molybdenum and silicon has a problem that when the molybdenum content is high, the chemical resistance and the cleaning resistance (particularly, alkaline cleaning or hot water cleaning) decrease. The molybdenum content is preferably set to not greater than 40 at % which can ensure the required minimum chemical resistance and cleaning resistance when used as a photomask. As is also clear from FIG. 9, while increasing the molybdenum content, the light-shielding performance of the MoSi film reaches a predetermined upper limit value. Since molybdenum is a rare metal, the molybdenum content is preferably set to 40 at % or less also in terms of the cost.

If a material with a somewhat high extinction coefficient k is selected as the front-surface antireflection layer, it is possible for the front-surface antireflection layer to somewhat contribute to the OD of the entire light-shielding film. In this case, a material with $\Delta OD=0.08$ $nm^{-1}$@193.4 nm or more may be selected as the light-shielding layer so that the content of molybdenum in the light-shielding layer in the form of the MoSi film can be set to 15 at % or more.

The light-shielding layer comprising molybdenum and silicon (MoSi film) represents a light-shielding layer substantially composed of molybdenum and silicon (including a metallic film substantially free of oxygen, nitrogen, etc. and a film made of a molybdenum silicide metal). Herein, being substantially free of oxygen and nitrogen includes a case in which oxygen and nitrogen are each less than 5 at % with respect to the components in the light-shielding layer).

Properly speaking, in terms of the light-shielding performance, it is preferable not to contain these elements in the light-shielding layer. However, since these elements are often incorporated as impurities at the stage of film forming processes, photomask manufacturing processes, or the like, the incorporation of such elements is allowed within a range not substantially affecting a reduction in light-shielding performance.

Further, other elements (carbon, boron, helium, hydrogen, argon, xenon, etc.) may be contained in the light-shielding layer in the form of the MoSi film within a range not impairing the properties and the functions and effects described above. The thickness of the light-shielding layer is preferably 30 nm to less than 40 nm and more preferably 30 nm to 35 nm. The light-shielding layer comprising molybdenum, silicon, and nitrogen (MoSiN film) represents a light-shielding layer substantially composed of molybdenum, silicon, and nitrogen (including a film made of a molybdenum silicide compound). For the same reason as that for the above-mentioned MoSi film, the case where the film is substantially free of oxygen includes an aspect in which oxygen is contained in a range capable of obtaining the functions and effects of this invention (the oxygen component is less than 5 at % in the light-shielding layer). Further, other elements (carbon, helium, hydrogen, argon, xenon, etc.) may be contained in the light-shielding layer in the form of the MoSiN film within a range not impairing the properties and the functions and effects described above.

When the light-shielding layer contains nitrogen, the light-shielding film can have the two-layer structure by giving a back-surface antireflection function to the light-shielding layer. Further, the etching rate of the light-shielding layer can be reduced as compared with the MoSi film, i.e. the light-shielding layer free of nitrogen. Therefore, as compared with the light-shielding film of the three-layer structure having the light-shielding layer in the form of the MoSi film, the difference in etching rate between the antireflection layer and the light-shielding layer can be reduced and thus the cross-sectional shape of a pattern can be made better. The content of nitrogen in the MoSiN film is preferably less than 40 at %. When the nitrogen content is less than 40 at %, the thickness of the light-shielding layer can be made small so that the light-shielding film can be set to 60 nm or less.

The thickness of the light-shielding layer in the form of the MoSiN film is preferably 40 nm or more and 50 nm or less. The front-surface antireflection layer preferably further contains silicon (including a silicide compound). Further, the front-surface antireflection layer preferably contains molybdenum. As a material of the front-surface antireflection layer, use can be made of an oxide, a nitride, or an oxynitride composed mainly of one or two or more kinds of transition metals selected from molybdenum, tantalum, tungsten, titanium, chromium, hafnium, nickel, vanadium, zirconium, ruthenium, rhodium, and the like, an oxide, a nitride, or an oxynitride composed mainly of silicon, an oxide, a nitride, or an oxynitride composed mainly of a transition metal silicide, or the like.

On the light-shielding layer containing the transition metal and silicon, use is made of the front-surface antireflection layer containing particularly the same silicon, and therefore, it is possible to obtain the light-shielding film with excellent properties in mask pattern processing and, further, using the material containing molybdenum and silicon, further excellent processing properties can be achieved.

The light-shielding film preferably comprises a back-surface antireflection layer formed under and in contact with the light-shielding layer and containing at least one of oxygen and nitrogen and silicon (including a silicide compound). With this structure, the antireflection can be achieved on the back side (light-transmitting substrate side) of the light-shielding film. Further, since all the layers, i.e. the front-surface antireflection layer, the light-shielding layer, and the back-surface antireflection layer, forming the light-shielding film are each made of the material composed mainly of silicon, it is possible to obtain the light-shielding film with excellent properties in mask pattern processing.

The front-surface antireflection layer and the back-surface antireflection layer may each be made of a material containing a transition metal, silicon, and at least one of oxygen and nitrogen (including a transition metal silicide compound) and the transition metals cited for the light-shielding layer are usable.

The thickness of the light-shielding film is preferably 60 nm or less. The front-surface antireflection layer preferably contains molybdenum, silicon, and at least one of oxygen and nitrogen, wherein the molybdenum content is preferably higher than 0 at % and 10 at % or less.

The present inventors have found that, by combining the light-shielding layer with a relatively high Mo content and the antireflection layer with a relatively low Mo content, it is possible to form the layer structure of the light-shielding film that satisfies the requirements in both optical properties and chemical resistance.

When the Mo content of the antireflection layer is in the above-mentioned range, the following functions and effects are obtained.

1) As compared with compositions which fall outside the scope of this invention, the antireflection layer is relatively excellent in chemical resistance (cleaning resistance).

2) As compared with compositions which fall outside the scope of this invention, the antireflection layer is relatively excellent in heat treatment resistance. Specifically, the antireflection layer with a Mo content in the above-mentioned range is prevented from becoming cloudy due to a heat treatment or prevented from the occurrence of degradation in front-surface reflectance distribution due to a heat treatment.

As the front-surface antireflection layer or the back-surface antireflection layer made of the material containing the transition metal, silicon, and at least one of oxygen and nitrogen, there can be cited MoSiON, MoSiO, MoSiN, MoSiOC, MoSiOCN, or the like. Among them, MoSiO or MoSiON is preferable in terms of the chemical resistance and the heat resistance while MoSiON is preferable in terms of the blank defect quality.

If Mo is increased in MoSiON, MoSiO, MoSiN, MoSiOC, MoSiOCN, or the like being the antireflection layer, the cleaning resistance, particularly the resistance to alkali (aqueous ammonia, etc.) or hot water, decreases. From this point of view, it is preferable to minimize Mo in MoSiON, MoSiO, MoSiN, MoSiOC, MoSiOCN, or the like being the antireflection layer.

It has been found that, upon carrying out a heat treatment (annealing) at a high temperature for the purpose of stress control, if the Mo content is high, a phenomenon that a film surface is clouded white (becomes cloudy) occurs. This is considered to be because MoO is precipitated on the surface. In terms of avoiding such a phenomenon, the content of Mo in MoSiON, MoSiO, MoSiN, MoSiOC, MoSiOCN, or the like being the antireflection layer is preferably less than 10 at %. However, if the Mo content is too low, abnormal discharge becomes significant in DC sputtering so that the defect occurrence frequency increases. Therefore, it is preferable to contain Mo in a range capable of carrying out the sputtering normally. According to another film forming technique, there is a case where the film formation is enabled without containing Mo.

The MoSi light-shielding layer is freely controllable in tensile stress and compressive stress by the Ar gas pressure, the He gas pressure, and a heat treatment. For example, by controlling the film stress of the MoSi light-shielding layer to be a tensile stress, it is possible to achieve balance with the compressive stress of the antireflection layer (e.g. MoSiON). That is, it is possible to cancel the stresses of the respective layers forming the light-shielding film and thus to reduce the film stress of the light-shielding film as much as possible (to substantially zero).

It is preferable to provide an etching mask film which is formed above and in contact with the light-shielding film and made of a material composed mainly of chromium.

This is for achieving a reduction in thickness of a resist.

The etching mask film is preferably formed of a material composed mainly of one of chromium nitride, chromium oxide, chromium oxynitride, and chromium oxycarbonitride.

This is because the etching selectivity is high with respect to the antireflection layer, formed under and in contact with the etching mask film, the light-shielding layer, and so on each being made of the material containing molybdenum and silicon, and therefore, the etching mask film, which has become unnecessary, can be removed without damaging the other layers.

As the etching mask film, use can be made of a material such as, for example, chromium alone or a material containing chromium and at least one kind of element from among oxygen, nitrogen, carbon, and hydrogen (material containing Cr). As a film structure of the etching mask film, use is often made of a single layer made of the above-mentioned film material, but use can also be made of a plural-layer structure. In the case of the plural-layer structure, it is possible to use a plural-layer structure formed with different compositions stepwise or a film structure in which the composition changes continuously.

Among them described above, chromium oxycarbonitride (CrOCN) is preferable as the material of the etching mask film in terms of stress controllability (low-stress film can be formed).

The thickness of the etching mask film is preferably 5 nm to 30 nm.

A photomask can be manufactured using the above-mentioned photomask blank.

For dry-etching the MoSi-based thin film (light-shielding film) in the manufacture of the photomask, use can be made of, for example, a fluorine-based gas such as $SF_6$, $CF_4$, $C_2F_6$, or $CHF_3$, a mixed gas of such a fluorine-based gas and He, $H_2$, $N_2$, Ar, $C_2H_4$, $O_2$ or the like, a chlorine-based gas such as $Cl_2$ or $CH_2Cl_2$, or a mixed gas of such a chlorine-based gas and He, $H_2$, $N_2$, Ar, $C_2H_4$, or the like.

For dry-etching the chromium-based thin film (etching mask film), it is preferable to use a dry etching gas in the form of a chlorine-based gas or in the form of a mixed gas containing a chlorine-based gas and an oxygen gas. This is because if the chromium-based thin film made of the material containing chromium and the elements such as oxygen and/or nitrogen is dry-etched using the above-mentioned dry etching gas, it is possible to increase the dry etching rate and thus to shorten the dry etching time so that a light-shielding film pattern with an excellent cross-sectional shape can be formed. As the chlorine-based gas for use as the dry etching gas, there can be cited, for example, $Cl_2$, $SiCl_4$, HCl, $CCl_4$, $CHCl_3$, or the like.

A synthetic quartz substrate can be cited as the light-transmitting substrate for use in the manufacture of the photomask blank.

The photomask blank includes an aspect in which a resist film is formed on the etching mask film. The photomask blank may be a binary photomask blank which does not use the phase shift effect, or a resist-coated mask blank. Alternatively, the photomask blank may be a halftone phase shift mask blank having a phase shift film between a light-transmitting substrate and a light-shielding film.

The phase shift film can have the same structure as conventional and is formed of, for example, a material comprising MoSiN, MoSiON, or the like.

Further, an etching stopper film having etching resistance to the light-shielding film or the phase shift film may be provided between the light-transmitting substrate and the light-shielding film or between the phase shift film and the light-shielding film. The etching stopper film is preferably in the form of a Cr-based material film like an etching mask film because, upon etching the etching stopper film, the etching mask film can be simultaneously stripped.

The photomask may be a binary photomask which does not use the phase shift effect and, among phase shift masks which use the phase shift effect, the photomask may be a halftone phase shift mask, a Levenson phase shift mask, or an enhancer mask. The photomask may be a reticle.

The photomask adapted to be applied with exposure light having a wavelength of 200 nm or less may be a photomask for ArF excimer laser exposure.

In the meantime, with respect to the photomask manufactured from the above-mentioned photomask blank, if it is considered to increase the number of times of use (use longer) as compared with a conventional photomask, the number of times of cleaning of the photomask during its use life also increases and, therefore, it is assumed that the film loss amount of the front-surface antireflection layer due to the cleaning during the use life also increases. Taking this point into account, conditions for selecting a material of the front-surface antireflection layer should be set such that the material is adapted to provide a front-surface reflectance of a predetermined value or less for the exposure light and has a property capable of controlling the change width of the front-surface reflectance at the exposure wavelength to be within 2% when the thickness of the front-surface antireflection layer is changed (reduced) in the range of 5 nm, and a selection should be made of the material having a refractive index n and an extinction coefficient k that satisfy the conditions.

In the case where the front-surface reflectance for the exposure light is set to 30%, when a study is made of a material of the front-surface antireflection layer satisfying the above-mentioned conditions by the same technique on the basis of the respective graphs in FIGS. 3 to 8, there is no material that satisfies the conditions in a material group with a refractive index n of 1.8 and, even if slightly exceeding 1.8, there is no material that satisfies the conditions. In a material group with a refractive index n of 2.1, there are materials that satisfy the conditions. In a material group with a refractive index of 3.0, there is no material that satisfies the conditions and, even if falling slightly below 3.0, the conditions are not satisfied. In a material group with a refractive index of 2.7, there are materials that satisfy the conditions.

On the other hand, in a material group with an extinction coefficient k of 0.3, there is no material that satisfies the conditions and, even if slightly exceeding 0.3, there is no material that satisfies the conditions. In a material group with an extinction coefficient k of 0.6, there are materials that satisfy the conditions. In a material group with an extinction coefficient k of 1.8, there is no material that satisfies the conditions and, even if falling slightly below 1.8, the conditions are not satisfied. In a material group with an extinction coefficient k of 1.5, there are materials that satisfy the conditions. From the study described above, it is seen that, as a material which is used as the front-surface antireflection layer and satisfies the above-mentioned conditions, a selection may be made of a material having a refractive index n of 2.1 or more and 2.7 or less and an extinction coefficient k of 0.6 or more and 1.5 or less.

In the case where the front-surface reflectance is set to 25% which is a more preferable condition, when a study is made by the same technique with reference to FIGS. 3 to 8, it is seen that, as a material of the front-surface antireflection layer satisfying the above-mentioned conditions, a selection may be made of a material having a refractive index n of 2.1 or more and 2.7 or less and an extinction coefficient k of 0.6 or more and 1.2 or less.

When the front-surface reflectance for the exposure light is 25% or less, conditions for selecting a material of the front-surface antireflection layer can be set such that the material has a property capable of controlling the change width of the front-surface reflectance at the exposure wavelength to be within 3% when the thickness of the front-surface antireflection layer is changed (reduced) in the range of 5 nm, and a selection can be made of the material having a refractive index n and an extinction coefficient k that satisfy the conditions.

When a study is made of a material of the front-surface antireflection layer satisfying the above-mentioned conditions by the same technique on the basis of the respective graphs in FIGS. 11 to 16, there is no material that satisfies the conditions in material groups with refractive indices n of 1.4 and 1.7. In a material group with a refractive index n of 2.0, there are materials that satisfy the conditions in the ranges where the extinction coefficient k is 1.0 and the thickness is 14 to 20 nm. In a material group with a refractive index n of 2.31, there are materials that satisfy the conditions in the ranges where the extinction coefficient k is 0.4 to 1.3 and the thickness is 10 to 20 nm. In a material group with a refractive index n of 2.6, there are materials that satisfy the conditions in the ranges where the extinction coefficient k is 0.4 to 1.0 and the thickness is 8 to 20 nm. In a material group with a refractive index of 2.9, there are materials that satisfy the conditions in the ranges where the extinction coefficient k is 0.4 to 1.0 and the thickness is 6 to 13 nm.

On the other hand, in a material group with an extinction coefficient k of 0.4, there are materials that satisfy the conditions in the ranges where the refractive index n is 2.31 to 2.9 and the thickness is 7 to 18 nm. In a material group with an extinction coefficient k of 0.7, there are materials that satisfy the conditions in the ranges where the refractive index n is 2.31 to 2.9 and the thickness is 6 to 20 nm. In a material group with an extinction coefficient k of 1.0, there are materials that satisfy the conditions in the ranges where the refractive index n is 2.0 to 2.9 and the thickness is 6 to 20 nm. In a material group with an extinction coefficient k of 1.3, there are materials that satisfy the conditions in the ranges where the refractive index n is 2.31 and the thickness is 15 to 20 nm. In material groups with extinction coefficients k of 1.6 and 1.9, there is no material that satisfies the conditions.

From the study described above, it is seen that, as a material which is used as the front-surface antireflection layer and satisfies the above-mentioned conditions, a selection may be made of a material having a refractive index n of 2.0 or more and 2.9 or less and an extinction coefficient k of 0.4 or more and 1.3 or less.

Further, when the front-surface reflectance for the exposure light is 25% or less, conditions are preferably set such that a material has a property capable of controlling the change width of the front-surface reflectance at the exposure wavelength to be within 2% when the thickness of the front-surface antireflection layer is changed (reduced) in the range of 5 nm.

When a study is made of a material of the front-surface antireflection layer satisfying the above-mentioned conditions on the basis of the respective graphs in FIGS. 11 to 16, there is no material that satisfies the conditions in material groups with refractive indices n of 1.4 and 1.7. In a material group with a refractive index n of 2.0, there are materials that satisfy the conditions in the ranges where the extinction coefficient k is 1.0 and the thickness is 15 to 20 nm. In a material group with a refractive index n of 2.31, there are materials that satisfy the conditions in the ranges where the extinction coefficient k is 0.4 to 1.3 and the thickness is 11 to 20 nm. In a material group with a refractive index n of 2.6, there are materials that satisfy the conditions in the ranges where the extinction coefficient k is 0.7 to 1.0 and the thickness is 8 to 17 nm. In a material group with a refractive index of 2.9, there are materials that satisfy the conditions in the ranges where the extinction coefficient k is 1.0 and the thickness is 6 to 12 nm.

On the other hand, in a material group with an extinction coefficient k of 0.4, there are materials that satisfy the conditions in the ranges where the refractive index n is 2.31 and the thickness is 12 to 18 nm. In a material group with an extinction coefficient k of 0.7, there are materials that satisfy the conditions in the ranges where the refractive index n is 2.31 to 2.6 and the thickness is 8 to 20 nm. In a material group with an extinction coefficient k of 1.0, there are materials that satisfy the conditions in the ranges where the refractive index n is 2.0 to 2.9 and the thickness is 6 to 20 nm. In a material group with an extinction coefficient k of 1.3, there are materials that satisfy the conditions in the ranges where the refractive index n is 2.31 and the thickness is 15 to 20 nm. In material groups with extinction coefficients k of 1.6 and 1.9, there is no material that satisfies the conditions.

From the study described above, it is seen that, as a material which is used as the front-surface antireflection layer and satisfies the above-mentioned conditions, a selection may be made of a material having a refractive index n of 2.0 or more and 2.9 or less and an extinction coefficient k of 0.4 or more and 1.3 or less.

Hereinbelow, Examples of this invention will be shown. In each Example, films such as a light-shielding film and an etching film were formed by a sputtering method as a film forming method using a DC magnetron sputtering apparatus as a sputtering apparatus. However, for carrying out this invention, there is no particular limitation to such a film forming method and film forming apparatus and use may be made of another type of sputtering apparatus such as an RF magnetron sputtering apparatus.

EXAMPLE 1

Optical Simulation and Selection of Front-Surface Antireflection Layer

A synthetic quartz substrate having a 6-inch square size with a thickness of 0.25 inches was used as a light-transmitting substrate 1 and, on this light-transmitting substrate 1, a MoSi film was formed under the same conditions as those for a light-shielding layer of a light-shielding film.

Specifically, using a target of Mo:Si=21:79 (at % ratio) and using Ar and He (gas flow rate ratio Ar:He=20:120) at a sputtering gas pressure of 0.3 Pa, a light-shielding layer comprising molybdenum and silicon was formed to a thickness of 30 nm by setting the power of the DC power supply to 2.0 kW.

Then, the refractive index n and the extinction coefficient k of the formed light-shielding layer were measured using an optical thin-film property measuring apparatus n&k 1280 (manufactured by n&k Technology, Inc.). It was confirmed that this light-shielding layer had a refractive index n of 2.42 and an extinction coefficient k of 2.89 and thus had high light-shielding performance.

Then, based on the measured refractive index n and extinction coefficient k of the light-shielding layer, optical simulations were carried out for selecting a front-surface antireflection layer to be formed on an upper surface of the light-shielding layer. The optical simulations were carried out by changing the refractive index n (in 6 levels of 1.5, 1.8, 2.1, 2.36, 2.7, and 3.0), the extinction coefficient k (in 6 levels of 0.3, 0.6, 0.9, 1.2, 1.5, and 1.8), and the thickness of front-surface antireflection layers as variable parameters.

The results thereof are shown in FIGS. 3 to 8 (graphs 1 to 6).

From the graphs 1 to 6, it is seen that if n and k of a front-surface antireflection layer 13 differ, a change in front-surface reflectance (slope of a curve in the graph) with respect to a change in thickness differs considerably.

In this Example, a light-shielding film has a front-surface reflectance of 25% or less and a front-surface antireflection layer is such that the change width of the front-surface reflectance falls within 2% when the thickness of the front-surface antireflection layer is changed in the range of 2 nm, and a selection is made of a material with n and k having such a property.

An additional condition desired for the front-surface antireflection layer is that its extinction coefficient k is as high as possible. This is because if the extinction coefficient k of the material is high, the light-shielding performance also becomes high, and therefore, even if the thickness of the light-shielding layer is made thin, it is possible to ensure an OD of a predetermined value or higher over the entire light-shielding film, thus achieving a reduction in thickness of the light-shielding film.

Figure 6:
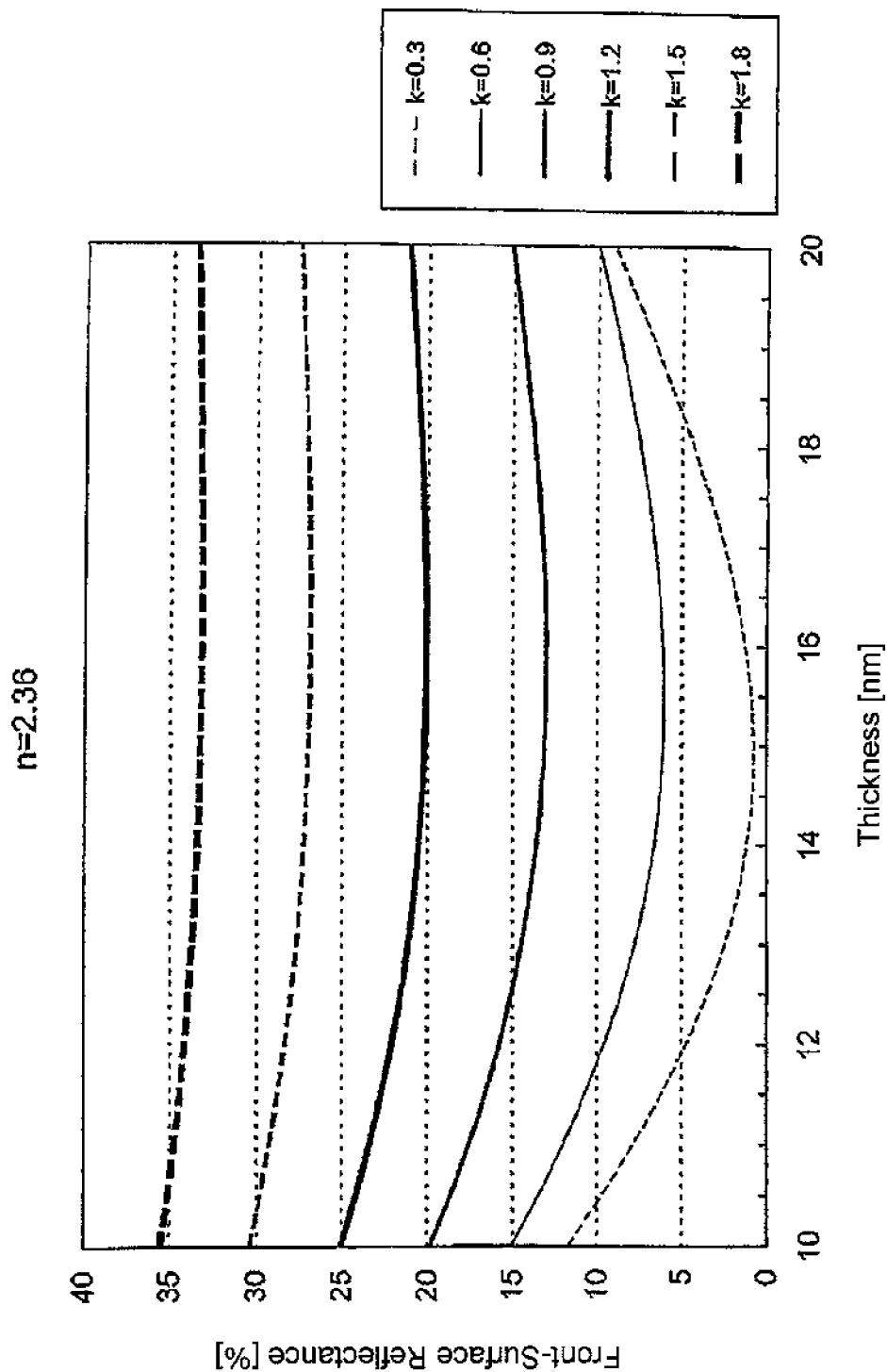
FIG. 6 is a diagram obtained in Example 1 of this invention and showing the relationships between the thickness and the front-surface reflectance of front-surface antireflection layers when the refractive index n of the front-surface antireflection layers is set to a value different from those in FIGS. 3, 4, and 5 while the extinction coefficient k thereof is changed to the plurality of values.
Figure 7:
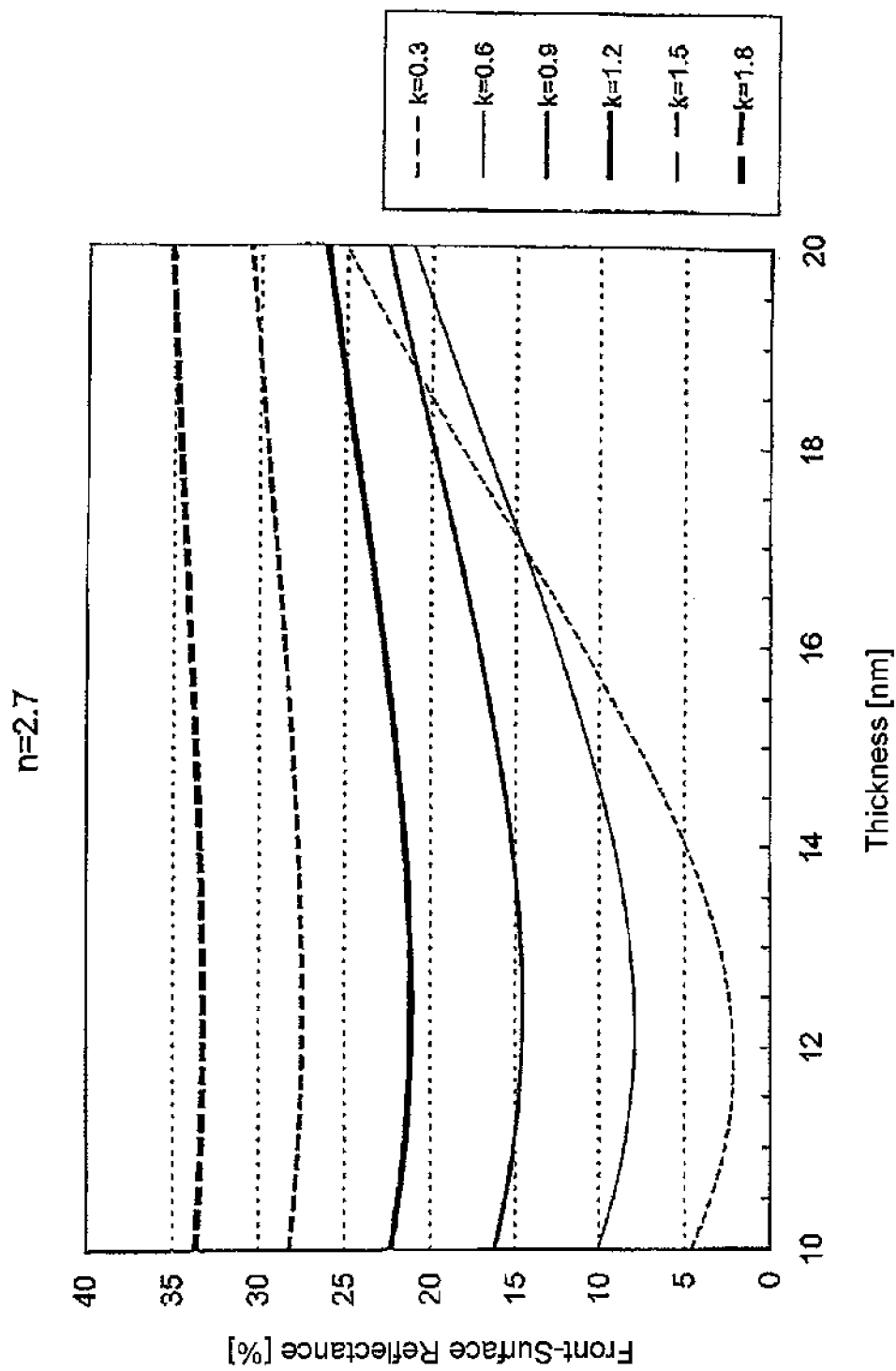
FIG. 7 is a diagram obtained in Example 1 of this invention and showing the relationships between the thickness and the front-surface reflectance of front-surface antireflection layers when the refractive index n of the front-surface antireflection layers is set to a value different from those in FIGS. 3, 4, 5, and 6 while the extinction coefficient k thereof is changed to the plurality of values.
Figure 8:
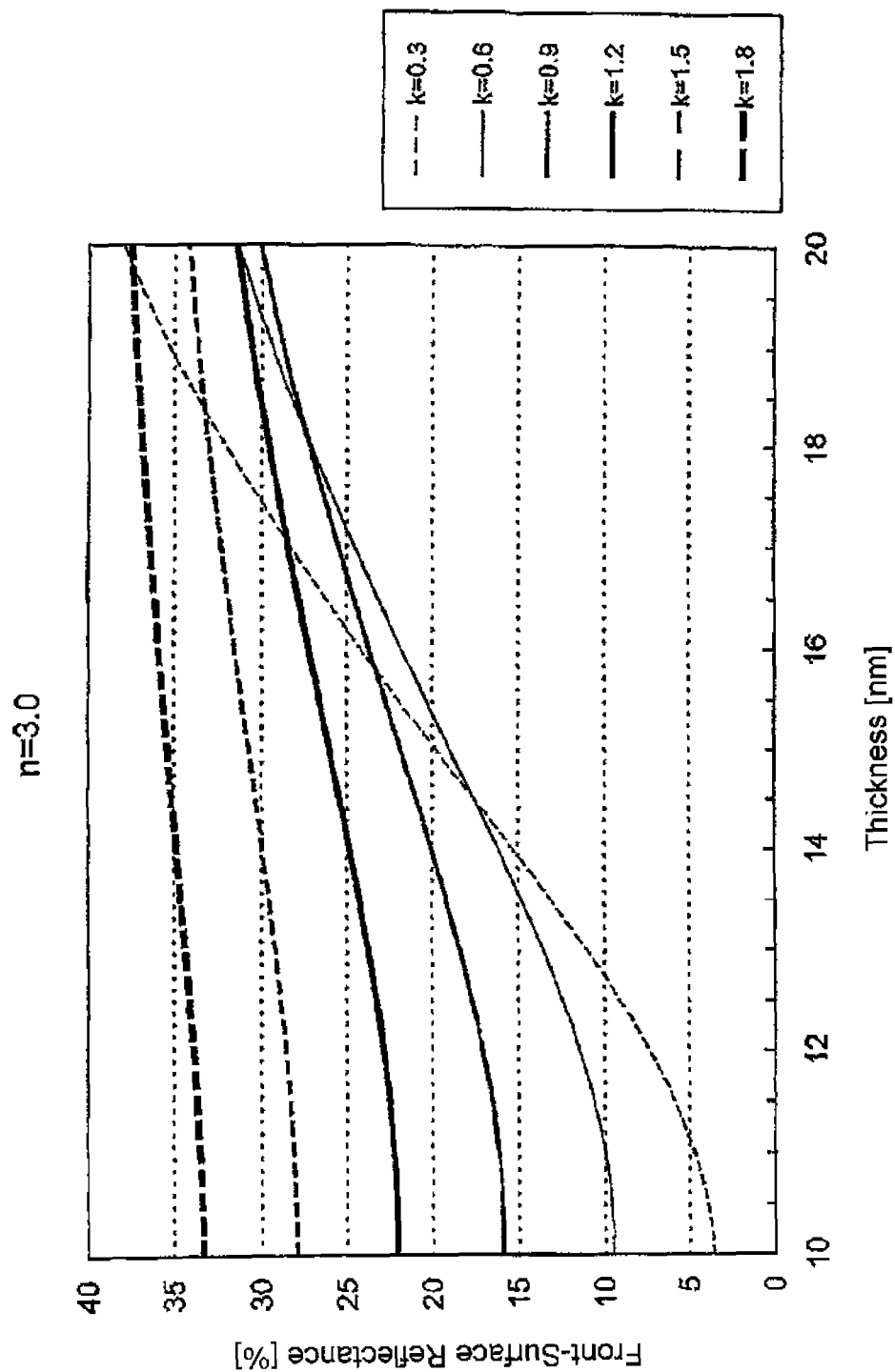
FIG. 8 is a diagram obtained in Example 1 of this invention and showing the relationships between the thickness and the front-surface reflectance of front-surface antireflection layers when the refractive index n of the front-surface antireflection layers is set to a value different from those in FIGS. 3, 4, 5, 6, and 7 while the extinction coefficient k thereof is changed to the plurality of values.

Taking these conditions into account, use is made of a thickness range of 13 nm to 15 nm in a curve (n=2.36, k=1.2) in the graph 4 shown in FIG. 6. As is also seen from FIG. 6 (graph 4), assuming that a mask blank is manufactured by forming a front-surface antireflection layer with a thickness of 15 nm and that the thickness is changed in the range of 2 nm due to mask cleaning or the like in the use after the manufacture of a photomask, the change width of the front-surface reflectance becomes 1.1% in simulation. Further, the front-surface reflectance after the film loss is 21.1% so that it is possible to ensure 25% or less. In addition, when the front-surface antireflection layer having this property is used, even if the thickness of a light-shielding layer is 30 nm and the thickness of a back-surface antireflection layer is 7 nm, it is possible to ensure an OD of a predetermined value or higher over the entire light-shielding film and thus to achieve a reduction in thickness of the light-shielding film.

In the case where it is allowed to enhance the light-shielding performance by somewhat increasing the thickness of the light-shielding layer, it is possible to use a material with a lower extinction coefficient k (e.g. k=0.3 etc.).

(Manufacture of Photomask Blank)
(Formation of Light-Shielding Film)

A photomask blank was actually manufactured using a light-shielding film structure which was selected as a result of the study described above. Using a synthetic quartz substrate having a 6-inch square size with a thickness of 0.25 inches as a light-transmitting substrate 1, a MoSiON film 11 (back-surface antireflection layer), a MoSi (light-shielding layer) 12, and a MoSiON film (front-surface antireflection layer) 13 were respectively formed as a light-shielding film 10 on the light-transmitting substrate 1 (FIG. 1).

Specifically, using a target of Mo:Si=21:79 (at % ratio) and using Ar, $O_2$, $N_2$, and He (gas flow rate ratio Ar:$O_2$:$N_2$:He=5:4:49:42) at a sputtering gas pressure of 0.2 Pa, a film comprising molybdenum, silicon, oxygen, and nitrogen (Mo: 0.3 at %, Si: 24.6 at %, O: 22.5 at %, N: 52.6 at %) (n: 2.39, k: 0.78) was formed to a thickness of 7 nm by setting the power of the DC power supply to 3.0 kW.

Then, using a target of Mo:Si=21:79 (at % ratio) and using Ar and He (gas flow rate ratio Ar:He=20:120) at a sputtering gas pressure of 0.3 Pa, a film comprising molybdenum and silicon (Mo: 21.0 at %, Si: 79 at %) (n: 2.42, k: 2.89) was formed to a thickness of 30 nm by setting the power of the DC power supply to 2.0 kW.

Then, using a target of Mo:Si=4:96 (at % ratio) and using Ar, $O_2$, $N_2$, and He (gas flow rate ratio Ar:$O_2$:$N_2$:He=6:5:11:16) at a sputtering gas pressure of 0.1 Pa, a film comprising molybdenum, silicon, oxygen, and nitrogen (Mo: 1.6 at %, Si: 38.8 at %, O: 18.8 at %, N: 41.1 at %) (n: 2.36, k: 1.20) was formed to a thickness of 15 nm by setting the power of the DC power supply to 3.0 kW. The total thickness of the light-shielding film 10 was set to 52 nm. The optical density (OD) of the light-shielding film 10 was 3 at a wavelength 193 nm of ArF excimer laser exposure light.

Then, the above-mentioned substrate was heat-treated (annealed) at 450° C. for 30 minutes, thereby reducing the film stress.

(Formation of Etching Mask Film)

Then, an etching mask film 20 was formed on the light-shielding film 10 (FIG. 1). Specifically, using a chromium target and using Ar, $CO_2$, $N_2$, and He (gas flow rate ratio An$CO_2$:$N_2$:He=21:37:11:31) at a sputtering gas pressure of 0.2 Pa, a CrOCN film (Cr content in the film: 33 at %) was formed to a thickness of 15 nm by setting the power of the DC power supply to 1.8 kW. In this event, the CrOCN film was annealed at a temperature lower than the annealing temperature of the MoSi light-shielding film, thereby adjusting the stress of the CrOCN film to be as small as possible (preferably, substantially zero) without affecting the film stress of the MoSi light-shielding film.

In this manner, a photomask blank formed with the light-shielding film for ArF excimer laser exposure was obtained.

The elements of the thin films were analyzed by the Rutherford backscattering spectrometry.

(Manufacture of Photomask)

Figure 2:
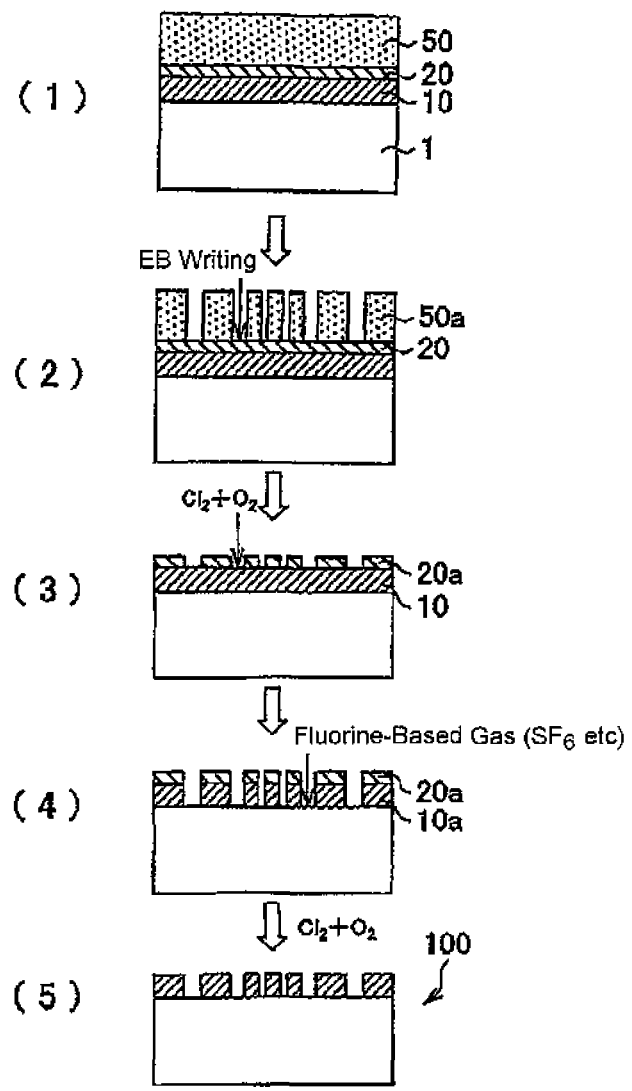
FIG. 2 is an exemplary cross-sectional view for explaining manufacturing processes of a photomask according to Example 1 of this invention.

On the etching mask film 20 of the photomask blank, a chemically amplified positive resist 50 for electron beam writing (exposure) (PRL009: manufactured by FUJIFILM Electronic Materials Co., Ltd.) was coated to a thickness of 100 nm by a spin-coating method (FIG. 1, FIG. 2(1)).

Then, using an electron beam writing apparatus, a desired pattern (40 nm, 45 nm, 50 nm, 55 nm, 60 nm line and space) was written on the resist film 50 and, thereafter, development was carried out using a predetermined developer, thereby forming a resist pattern 50a (FIG. 2(2)).

Then, using the resist pattern 50a as a mask, the etching mask film 20 was dry-etched (FIG. 2(3)). A mixed gas of $Cl_2$ and $O_2$ ($Cl_2$:$O_2$=4:1) was used as a dry etching gas.

Then, the remaining resist pattern 50a was stripped and removed by a chemical solution.

Then, using an etching mask film pattern 20a as a mask, the light-shielding film 10 was dry-etched using a mixed gas of $SF_6$ and He, thereby forming a light-shielding film pattern 10a (FIG. 2(4)).

Then, the etching mask film pattern 20a was stripped by dry etching with a mixed gas of $Cl_2$ and $O_2$ (FIG. 2(5)) and then predetermined cleaning was carried out, thereby obtaining a photomask 100.

(Evaluation)

Figure 10:
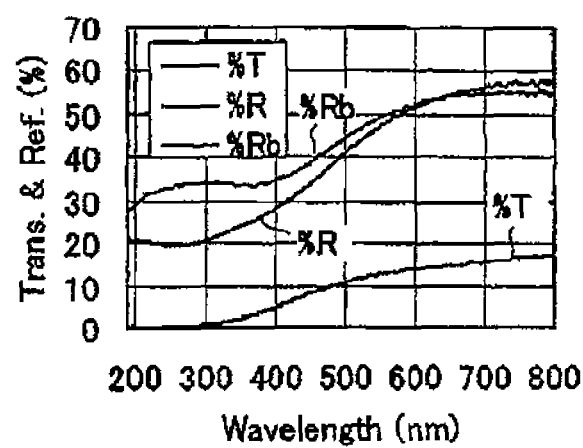
FIG. 10 is a diagram showing the reflection and transmission spectra of a light-shielding film obtained in Example 1 of this invention.
Figure 11:
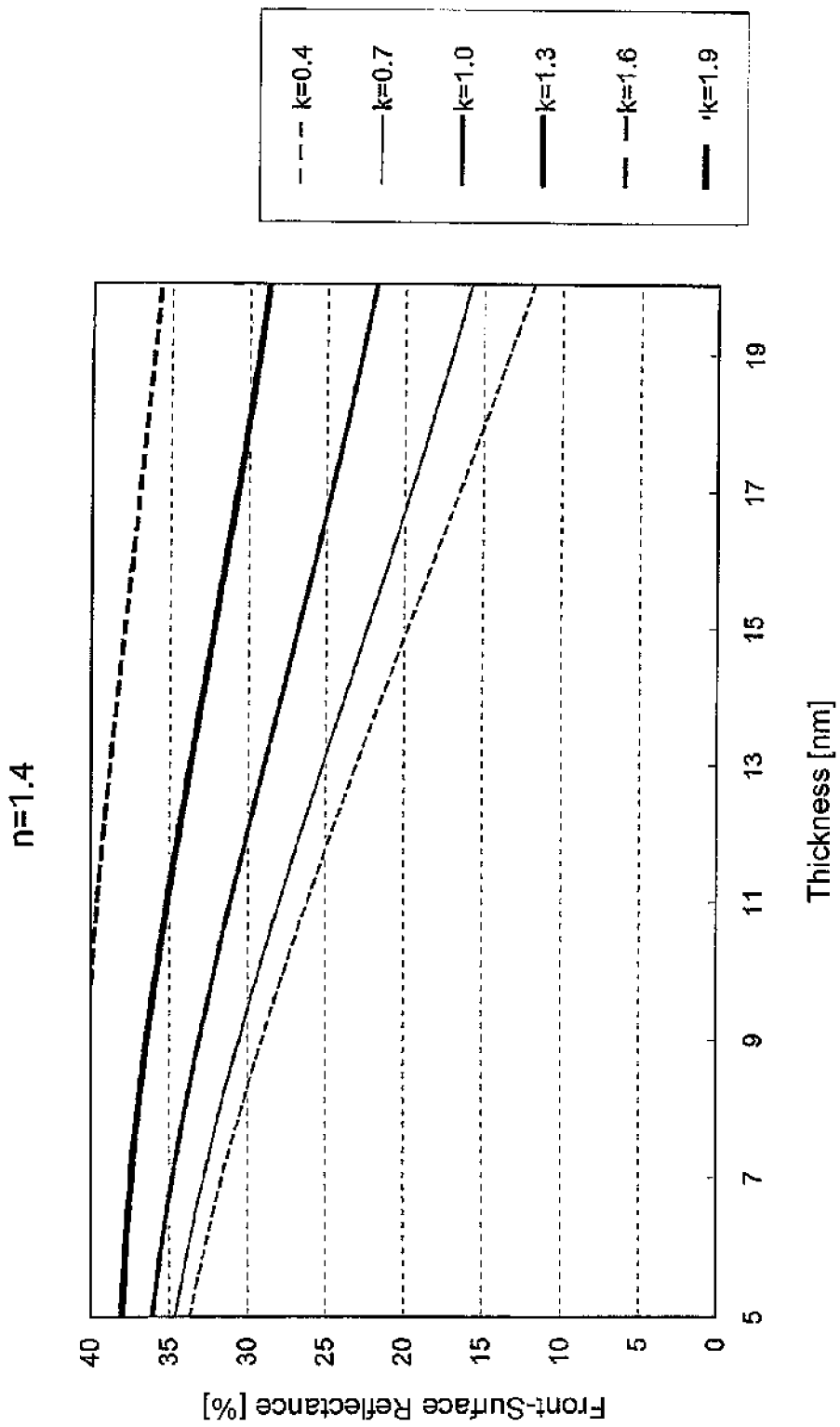
FIG. 11 is a diagram obtained in Example 3 of this invention and showing the relationships between the thickness and the front-surface reflectance of front-surface antireflection layers when the refractive index n of the front-surface antireflection layers is fixed while the extinction coefficient k thereof is changed to a plurality of values.
Figure 12:
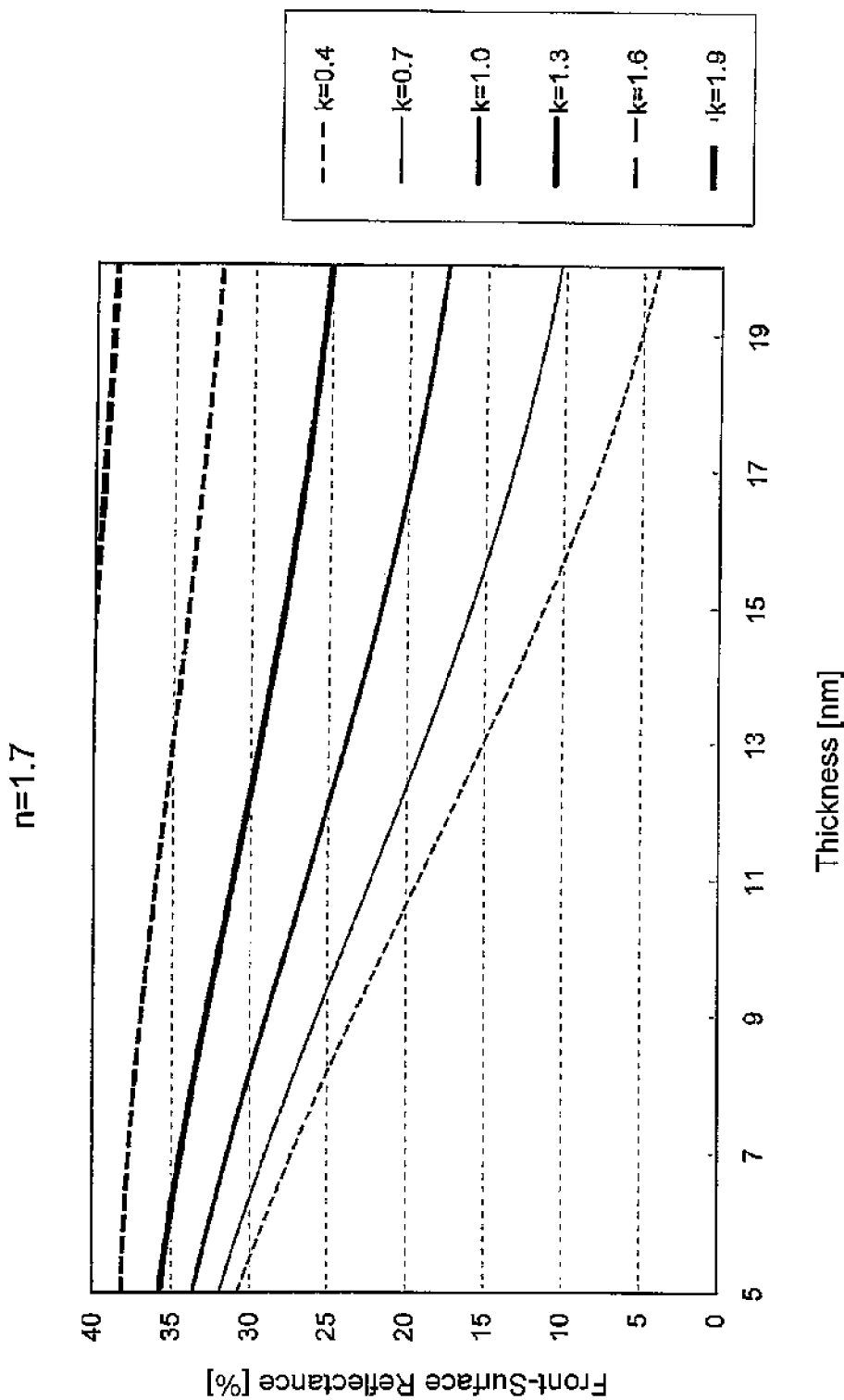
FIG. 12 is a diagram obtained in Example 3 of this invention and showing the relationships between the thickness and the front-surface reflectance of front-surface antireflection layers when the refractive index n of the front-surface antireflection layers is set to a value different from that in FIG. 11 while the extinction coefficient k thereof is changed to the plurality of values.
Figure 13:
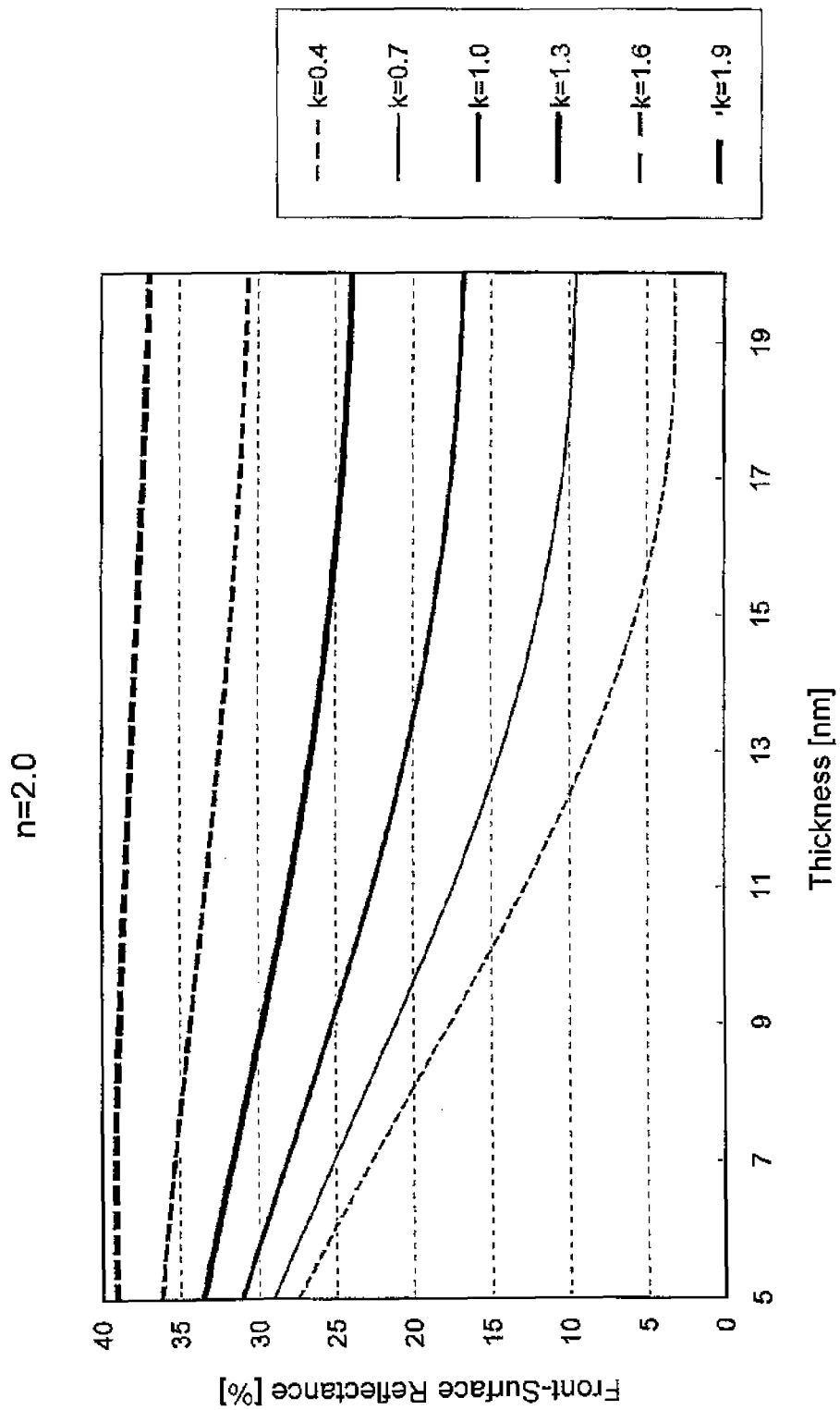
FIG. 13 is a diagram obtained in Example 3 of this invention and showing the relationships between the thickness and the front-surface reflectance of front-surface antireflection layers when the refractive index n of the front-surface antireflection layers is set to a value different from those in FIGS. 11 and 12 while the extinction coefficient k thereof is changed to the plurality of values.

For the photomask thus obtained, the front-surface reflectance (% R), the back-surface reflectance (% Rb), and the OD (% T) upon irradiation of light having a wavelength of 193 nm to 800 nm were measured using a spectrophotometer U-4100 (manufactured by Hitachi High-Technologies Corporation). The results were obtained as shown in FIG. 10. It was seen that the properties (front-surface reflectance % R: 20.8%, back-surface reflectance % Rb: 28.1%) for ArF exposure light (wavelength 193 nm) for use with the photomask were excellent and further that the properties at a wavelength of inspection light (e.g. 250 nm to 433 nm) for use in a mask inspection apparatus or the like were also excellent.

Then, this photomask was cleaned with ozone water normally used in photomask cleaning, thereby reducing the thickness of the front-surface antireflection layer 13 by 2 nm. The front-surface reflectance was measured in the same manner and it was 22.1%, and therefore, the change amount of the front-surface reflectance due to the film loss was 1.3% and thus was suppressed within 2%.

EXAMPLE 2

Selection of Front-Surface Antireflection Layer

This Example 2 aims at providing a light-shielding film having a front-surface reflectance of 25% or less and at providing a front-surface antireflection layer such that the change width of the front-surface reflectance falls within 2% when the thickness of the front-surface antireflection layer is changed in the range of 5 nm, which is a stricter condition, and a selection was made of a material with n and k having such a property.

Taking these conditions into account, use is made of a thickness range of 17 nm to 12 nm in a curve (n=2.36, k=1.2) in the graph 4 shown in FIG. 6. As is also seen from FIG. 6 (graph 4), assuming that a mask blank is manufactured by forming a front-surface antireflection layer with a thickness of 17 nm and that the thickness is changed in the range of 5 nm due to mask cleaning or the like in the use after the manufacture of a photomask, the change width of the front-surface reflectance becomes 1.8% in simulation. Further, the front-surface reflectance after the film loss is 22.1% so that it is possible to ensure 25% or less.

(Manufacture of Photomask Blank and Photomask)

A photomask blank was actually manufactured using a light-shielding film structure which was selected as a result of the study described above. The photomask blank had the same structure as the photomask blank of Example 1 except that the thickness of a front-surface antireflection layer was set to 17 nm, and was manufactured by the same processes as in Example 1. Further, a photomask was manufactured from the manufactured photomask blank in the same manner as in Example 1.

(Evaluation)

For the photomask thus obtained, the front-surface reflectance (% R) and the back-surface reflectance (% Rb) upon irradiation of ArF exposure light (wavelength 193 nm) were measured using a spectrophotometer U-4100 (manufactured by Hitachi High-Technologies Corporation). Excellent results were obtained such that the front-surface reflectance % R was 20.2% and the back-surface reflectance % Rb was 28.1%.

Then, this photomask was cleaned with ozone water normally used in photomask cleaning, thereby reducing the thickness of the front-surface antireflection layer 13 by 5 nm. The front-surface reflectance was measured in the same manner and it was 22.1%, and therefore, the change amount of the front-surface reflectance due to the film loss was 1.9% and thus was suppressed within 2%.

EXAMPLE 3

Optical Simulation and Selection of Front-Surface Antireflection Layer

This Example was the same as Example 1 except that the light-shielding layer was changed from the MoSi film to a MoSiN film so that a light-shielding film had a two-layer structure.

On a light-transmitting substrate, a MoSiN film was formed under the same conditions as those for a light-shielding layer of a light-shielding film.

Specifically, using a target of Mo:Si=21:79 (at % ratio) and using Ar and $N_2$ (gas flow rate ratio Ar:$N_2$=25:28) at a sputtering gas pressure of 0.07 Pa, a light-shielding layer comprising molybdenum, silicon, and nitrogen was formed to a thickness of 50 nm by setting the power of the DC power supply to 2.1 kW.

Then, the refractive index n and the extinction coefficient k of the formed light-shielding layer were measured using an optical thin-film property measuring apparatus n&k 1280 (manufactured by n&k Technology, Inc.). It was confirmed that this light-shielding layer had a refractive index n of 2.42 and an extinction coefficient k of 1.91 and thus had high light-shielding performance.

Then, based on the measured refractive index n and extinction coefficient k of the light-shielding layer, optical simulations were carried out for selecting a front-surface antireflection layer to be formed on an upper surface of the light-shielding layer. The optical simulations were carried out by changing the refractive index n (in 6 levels of 1.4, 1.7, 2.0, 2.31, 2.6, and 2.9), the extinction coefficient k (in 6 levels of 0.4, 0.7, 1.0, 1.3, 1.6, and 1.9), and the thickness of front-surface antireflection layers as variable parameters.

The results thereof are shown in FIGS. 11 to 16 (graphs 7 to 12).

From the graphs 7 to 12, it is seen that if n and k of the front-surface antireflection layer differ, a change in front-surface reflectance (slope of a curve in the graph) with respect to a change in thickness differs considerably.

In this Example, a light-shielding film has a front-surface reflectance of 25% or less and a front-surface antireflection layer is such that the change width of the front-surface reflectance falls within 3% when the thickness of the front-surface antireflection layer is changed in the range of 2 nm, and a selection is made of a material with n and k having such a property.

An additional condition desired for the front-surface antireflection layer is that its extinction coefficient k is as high as possible. This is because if the extinction coefficient k of the material is high, the light-shielding performance also becomes high, and therefore, even if the thickness of the light-shielding layer is made thin, it is possible to ensure an OD of a predetermined value or higher over the entire light-shielding film, thus achieving a reduction in thickness of the light-shielding film.

Figure 14:
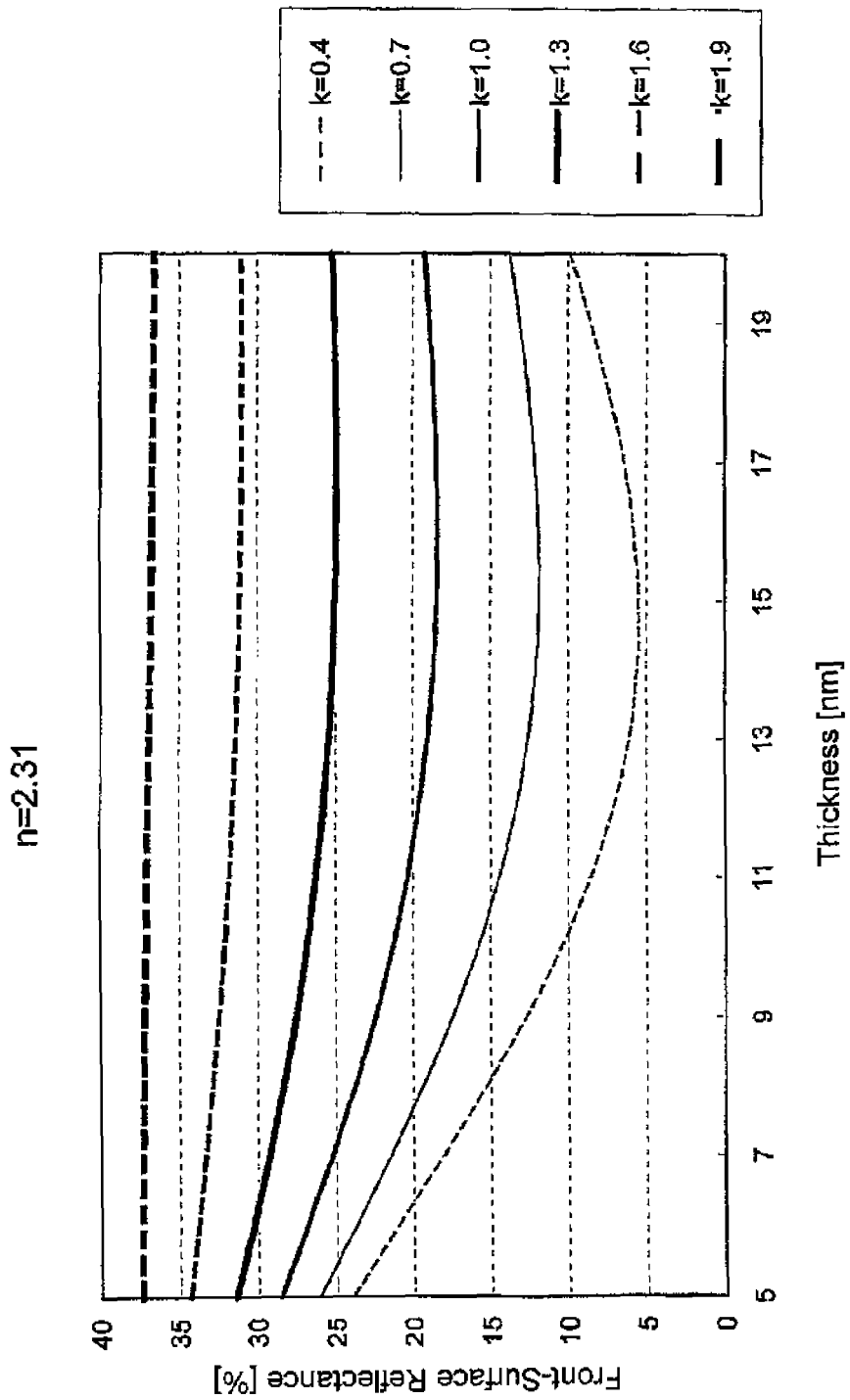
FIG. 14 is a diagram obtained in Example 3 of this invention and showing the relationships between the thickness and the front-surface reflectance of front-surface antireflection layers when the refractive index n of the front-surface antireflection layers is set to a value different from those in FIGS. 11, 12, and 13 while the extinction coefficient k thereof is changed to the plurality of values.
Figure 15:
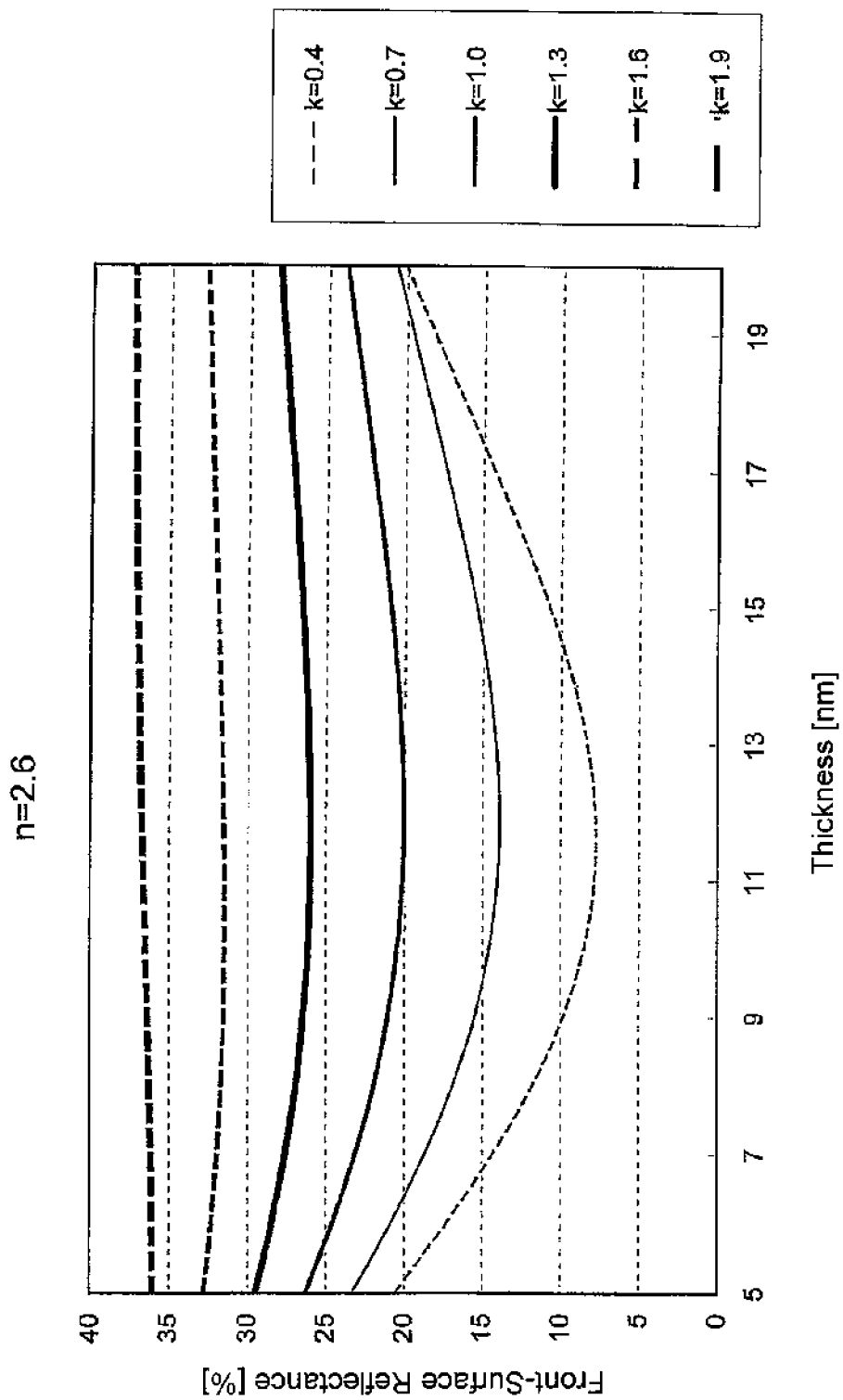
FIG. 15 is a diagram obtained in Example 3 of this invention and showing the relationships between the thickness and the front-surface reflectance of front-surface antireflection layers when the refractive index n of the front-surface antireflection layers is set to a value different from those in FIGS. 11, 12, 13, and 14 while the extinction coefficient k thereof is changed to the plurality of values.
Figure 16:
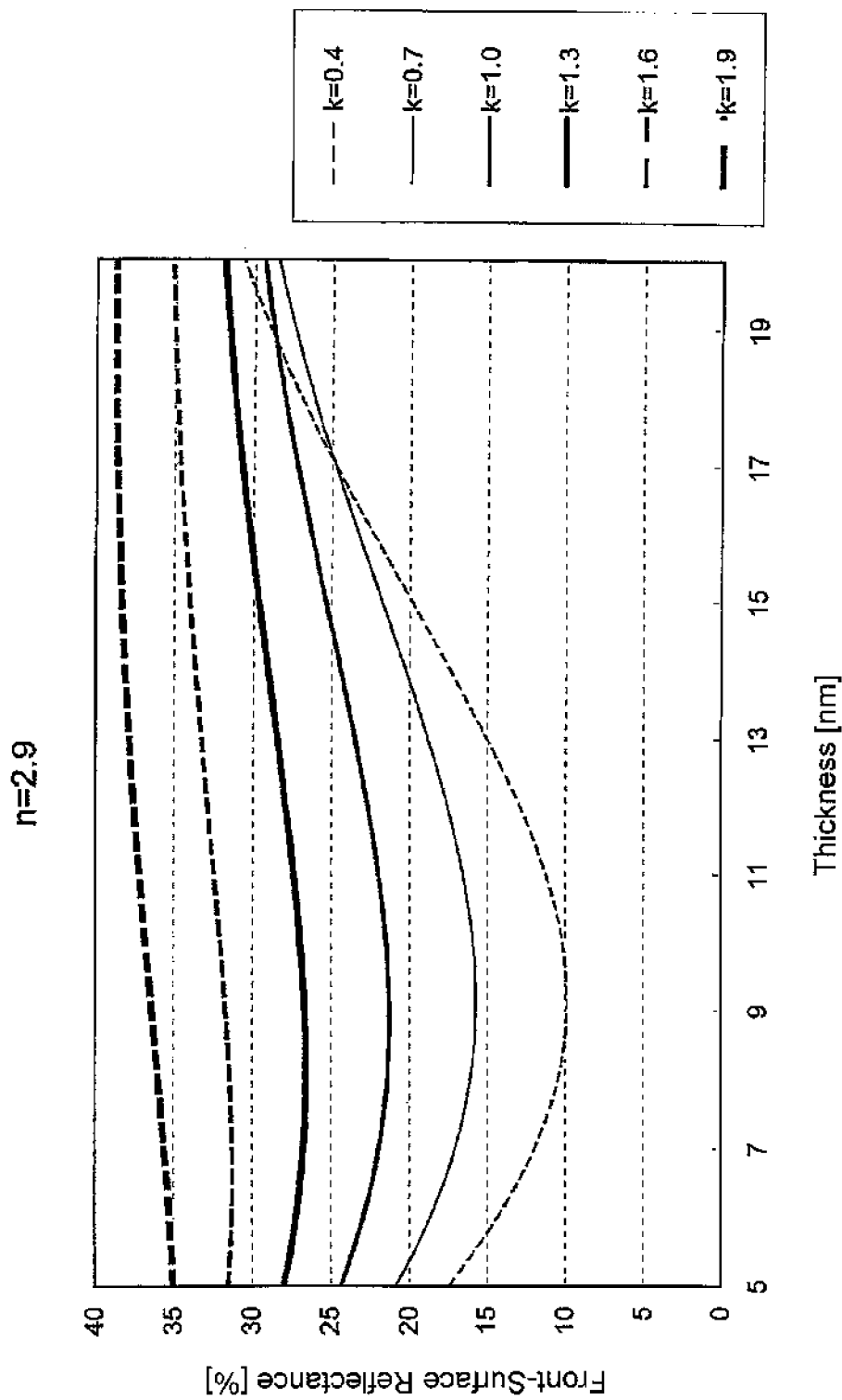
FIG. 16 is a diagram obtained in Example 3 of this invention and showing the relationships between the thickness and the front-surface reflectance of front-surface antireflection layers when the refractive index n of the front-surface antireflection layers is set to a value different from those in FIGS. 11, 12, 13, 14, and 15 while the extinction coefficient k thereof is changed to the plurality of values.

Taking these conditions into account, use is made of a thickness range of 8 nm to 10 nm in a curve (n=2.31, k=1.0) in the graph 10 shown in FIG. 14. As is also seen from FIG. 14 (graph 10), assuming that a mask blank is manufactured by forming a front-surface antireflection layer with a thickness of 10 nm and that the thickness is changed in the range of 2 nm due to mask cleaning or the like in the use after the manufacture of a photomask, the change width of the front-surface reflectance becomes 2.5% in simulation. Further, the front-surface reflectance after the film loss is 23.8% so that it is possible to ensure 25% or less. In addition, when the front-surface antireflection layer having this property is used, it is possible to ensure an OD of a predetermined value or higher over the entire light-shielding film and thus to achieve a reduction in thickness of the light-shielding film.

In the case where it is allowed to enhance the light-shielding performance by somewhat increasing the thickness of the light-shielding layer, it is possible to use a material with a lower extinction coefficient k (e.g. k=0.4 etc.).

(Manufacture of Photomask Blank and Photomask)

A photomask blank was actually manufactured using a light-shielding film structure which was selected as a result of the study described above. This Example differed from Example 1 in that the light-shielding layer was changed from the MoSi film to a MoSiN film and that a light-shielding film had a two-layer structure provided with no back-surface antireflection layer. That is, a MoSiN film (light-shielding layer) and a MoSiON film (front-surface antireflection layer) were respectively formed as a light-shielding film on a light-transmitting substrate.

Specifically, using a target of Mo:Si=21:79 (at % ratio) and using Ar and $N_2$ (gas flow rate ratio Ar:$N_2$=25:28) at a sputtering gas pressure of 0.07 Pa, a film comprising molybdenum, silicon, and nitrogen (Mo: 14.7 at %, Si: 56.2 at %, N: 29.1 at %) (n: 2.42, k: 1.91) was formed to a thickness of 50 nm by setting the power of the DC power supply to 2.1 kW.

Then, using a target of Mo:Si=4:96 (at % ratio) and using Ar, $O_2$, $N_2$, and He (gas flow rate ratio Ar:$O_2$:$N_2$:He=6:3:11:17) at a sputtering gas pressure of 0.1 Pa, a film comprising molybdenum, silicon, oxygen, and nitrogen (Mo: 2.6 at %, Si: 57.1 at %, O: 15.9 at %, N: 24.4 at %) (n: 2.31, k: 1.00) was formed to a thickness of 10 nm by setting the power of the DC power supply to 3.0 kW.

The total thickness of the light-shielding film was set to 60 nm. The optical density (OD) of the light-shielding film was 3 at a wavelength 193 nm of ArF excimer laser exposure light.

Then, the above-mentioned substrate was heat-treated (annealed) at 450° C. for 30 minutes, thereby reducing the film stress.

Then, an etching mask film and a chemically amplified positive resist for electron beam writing (exposure) which were the same as those in Example 1 were formed on the light-shielding film.

Then, a photomask was obtained in the same manner as in Example 1.

(Evaluation)

For the photomask thus obtained, the front-surface reflectance (% R) and the back-surface reflectance (% Rb) upon irradiation of ArF exposure light (wavelength 193 nm) were measured using a spectrophotometer U-4100 (manufactured by Hitachi High-Technologies Corporation). Excellent results were obtained such that the front-surface reflectance % R was 15.7% and the back-surface reflectance % Rb was 32.7%.

Then, this photomask was cleaned with ozone water normally used in photomask cleaning, thereby reducing the thickness of the front-surface antireflection layer by 2 nm. The front-surface reflectance was measured in the same manner and it was 18.3%, and therefore, the change amount of the front-surface reflectance due to the film loss was 2.6% and thus was suppressed within 3%.

EXAMPLE 4

Selection of Front-Surface Antireflection Layer

This Example 4 aims at providing a light-shielding film having a front-surface reflectance of 25% or less and at providing a front-surface antireflection layer such that the change width of the front-surface reflectance falls within 2% when the thickness of the front-surface antireflection layer is changed in the range of 5 nm, which is a stricter condition, and a selection was made of a material with n and k having such a property.

Taking these conditions into account, use is made of a thickness range of 11 nm to 16 nm in a curve (n=2.31, k=1.0) in the graph 10 shown in FIG. 14. As is also seen from FIG. 14 (graph 10), assuming that a mask blank is manufactured by forming a front-surface antireflection layer with a thickness of 16 nm and that the thickness is changed in the range of 5 nm due to mask cleaning or the like in the use after the manufacture of a photomask, the change width of the front-surface reflectance becomes 1.9% in simulation. Further, the front-surface reflectance after the film loss is 20.4% so that it is possible to ensure 25% or less.

(Manufacture of Photomask Blank and Photomask)

A photomask blank was actually manufactured using a light-shielding film structure which was selected as a result of the study described above. The photomask blank had the same structure as the photomask blank of Example 3 except that the thickness of a front-surface antireflection layer was set to 16 nm and that the thickness of a light-shielding layer was set to 44 nm, and was manufactured by the same processes as in Example 3. Further, a photomask was manufactured from the manufactured photomask blank in the same manner as in Example 1.

(Evaluation)

For the photomask thus obtained, the front-surface reflectance (% R) and the back-surface reflectance (% Rb) upon irradiation of ArF exposure light (wavelength 193 nm) were measured using a spectrophotometer U-4100 (manufactured by Hitachi High-Technologies Corporation). Excellent results were obtained such that the front-surface reflectance % R was 19.3% and the back-surface reflectance % Rb was 31.5%.

Then, this photomask was cleaned with ozone water normally used in photomask cleaning, thereby reducing the thickness of the front-surface antireflection layer by 5 nm. The front-surface reflectance was measured in the same manner and it was 22.1%, and therefore, the change amount of the front-surface reflectance due to the film loss was 1.8% and thus was suppressed within 2%.

While this invention has been described with reference to the Examples, the technical scope of the invention is not limited to the scope of the description of the above-mentioned Examples. It is obvious to a person skilled in the art that various changes or improvements can be added to the above-mentioned Examples. It is clear from the description of claims that the modes added with such changes or improvements can also be included in the technical scope of this invention.

DESCRIPTION OF SYMBOLS

1 light-transmitting substrate
10 light-shielding film
11 back-surface antireflection layer
12 light-shielding layer
13 front-surface antireflection layer
20 etching mask film
50 resist film
100 photomask

The invention claimed is:

1. A photomask blank for use in manufacturing a photomask adapted to be applied with exposure light having a wavelength of 200 nm or less,
wherein the photomask blank comprises a light-transmitting substrate and a light-shielding film formed on the light-transmitting substrate,
the light-shielding film comprises a light-shielding layer containing a transition metal and silicon and a front-surface antireflection layer formed above and in contact with the light-shielding layer and made of a material containing a transition metal, silicon, and at least one of oxygen and nitrogen, and
the front-surface antireflection layer has a refractive index n being 1.4 or more and 2.9 or less and an extinction coefficient k being 0.4 or more and 1.3 or less.

2. The photomask blank according to claim 1, wherein the front-surface antireflection layer has a thickness of 20 nm or less.

3. The photomask blank according to claim 1, wherein the transition metal of the front-surface antireflection layer has a content being higher than 0 at % and 10 at % or less.

4. The photomask blank according to claim 1, wherein the transition metal of the front-surface antireflection layer is selected from molybdenum, tantalum, tungsten, titanium, chromium, hafnium, nickel, vanadium, zirconium, ruthenium, and rhodium.

5. The photomask blank according to claim 1, wherein the front-surface antireflection layer is formed of a material selected from MoSiON, MoSiO, MoSiN, MoSiOC, and MoSiOCN.

6. The photomask blank according to claim 1, wherein the light-shielding layer has a thickness of 40 nm or more and 50 nm or less.

7. The photomask blank according to claim 1, wherein the transition metal of the light-shielding layer is selected from molybdenum, tantalum, tungsten, titanium, chromium, hafnium, nickel, vanadium, zirconium, ruthenium, and rhodium.

8. The photomask blank according to claim 1, wherein the light-shielding layer is formed of a material substantially comprising molybdenum, silicon, and nitrogen.

9. The photomask blank according to claim 8, wherein the nitrogen of the light-shielding layer has a content being less than 40 at %.

10. The photomask blank according to claim 1, wherein the light-shielding film has a thickness of 60 nm or less.

11. The photomask blank according to claim 1, further comprising an etching mask formed on the light-shielding film.

12. The photomask blank according to claim 11, wherein the etching mask is formed of chromium alone or a material containing chromium and at least one kind of element from among oxygen, nitrogen, carbon, and hydrogen.

13. The photomask blank according to claim 1, which is a resist-coated mask blank.

14. A photomask, which is manufactured by using the photomask blank according to claim 1.

15. A method of manufacturing a photomask, comprising using the photomask blank according to claim 1.

16. A method of manufacturing a semiconductor device, comprising transferring a pattern of the photomask according to claim 14.

* * * * *